(12) United States Patent
Fiolka et al.

(10) Patent No.: US 7,847,920 B2
(45) Date of Patent: Dec. 7, 2010

(54) ILLUMINATION SYSTEM AND POLARIZER FOR A MICROLITHOGRAPHIC PROJECTION EXPOSURE APPARATUS

(75) Inventors: Damian Fiolka, Oberkochen (DE); Axel Scholz, Aalen (DE); Manfred Maul, Aalen (DE)

(73) Assignee: Carl Zeiss SMT AG, Oberkochen (DE)

( * ) Notice: Subject to any disclaimer, the term of this patent is extended or adjusted under 35 U.S.C. 154(b) by 736 days.

(21) Appl. No.: 11/703,259

(22) Filed: Apr. 30, 2007

(65) Prior Publication Data

US 2008/0239273 A1    Oct. 2, 2008

Related U.S. Application Data

(63) Continuation of application No. 10/994,141, filed on Nov. 19, 2004, now Pat. No. 7,408,622, which is a continuation of application No. PCT/EP2004/008892, filed on Aug. 9, 2004, and a continuation-in-part of application No. PCT/EP03/09017, filed on Aug. 14, 2003.

(51) Int. Cl.
*G03B 27/72* (2006.01)
*G03B 27/42* (2006.01)

(52) U.S. Cl. .......................... 355/71; 355/53
(58) Field of Classification Search ............. 355/71, 355/53, 67
See application file for complete search history.

(56) References Cited

U.S. PATENT DOCUMENTS 5,422,866 A    6/1995    Yamaguchi et al.

(Continued)

FOREIGN PATENT DOCUMENTS

DE    44 21 053    12/1995

(Continued)

OTHER PUBLICATIONS

Schmitz et al., "Gratings in the Resonance Domain as Polarizing Beam Splitters", Optical Society of America, vol. 20, No. 17, pp. 1830-1831, Sep. 17, 1995.

(Continued)

*Primary Examiner*—Peter B Kim
(74) *Attorney, Agent, or Firm*—Fish & Richardson P.C.

(57) ABSTRACT

An illumination system for illuminating a reticle that moves along a scanning direction in a microlithographic projection exposure apparatus has an optical axis and an optical component producing an illumination angle distribution of the projection light. In accordance with the illumination angle distribution, a plurality of poles is illuminated in a pupil plane of the illumination system. The poles form an arrangement that is only mirror-symmetrical with respect to an axis that is orthogonal to the optical axis of the illumination, but neither parallel nor perpendicular to the scanning direction.

13 Claims, 19 Drawing Sheets

U.S. PATENT DOCUMENTS

| | | |
|---|---|---|
| 5,559,634 A | 9/1996 | Weber |
| 5,673,103 A | 9/1997 | Inoue et al. |
| 5,677,755 A | 10/1997 | Oshida et al. |
| 5,739,898 A | 4/1998 | Ozawa et al. |
| 5,748,369 A | 5/1998 | Yokota |
| 5,757,547 A | 5/1998 | Rodman et al. |
| 5,815,247 A | 9/1998 | Poschenrieder et al. |
| 5,872,617 A | 2/1999 | Unno |
| 5,982,558 A | 11/1999 | Furter et al. |
| 6,028,660 A | 2/2000 | Van Der Laan et al. |
| 6,045,976 A | 4/2000 | Haruki et al. |
| 6,067,193 A | 5/2000 | Sekine et al. |
| 6,072,629 A | 6/2000 | Fan et al. |
| 6,097,474 A | 8/2000 | McCullough et al. |
| 6,139,157 A | 10/2000 | Okuyuma |
| 6,191,880 B1 | 2/2001 | Schuster |
| 6,211,944 B1 | 4/2001 | Shiraishi |
| 6,252,647 B1 | 6/2001 | Shiraishi |
| 6,257,726 B1 | 7/2001 | Okuyama |
| 6,285,443 B1 | 9/2001 | Wangler et al. |
| 6,324,330 B1 | 11/2001 | Stites |
| 6,392,800 B2 | 5/2002 | Schuster |
| 6,450,645 B1 | 9/2002 | Jeon |
| 6,480,330 B1 | 11/2002 | McClay et al. |
| 6,535,273 B1 | 3/2003 | Maul |
| 6,535,334 B2 | 3/2003 | Kane |
| 6,618,174 B2 | 9/2003 | Parker et al. |
| 6,775,061 B2 | 8/2004 | Drazic |
| 6,885,502 B2 | 4/2005 | Schuster |
| 6,930,758 B2 | 8/2005 | Schuster et al. |
| 6,950,174 B2 | 9/2005 | Schuster et al. |
| 6,972,831 B2 | 12/2005 | Schuster et al. |
| 2001/0019404 A1* | 9/2001 | Schuster et al. ............... 355/67 |
| 2001/0022691 A1 | 9/2001 | Furter et al. |
| 2002/0036832 A1 | 3/2002 | Shultz et al. |
| 2002/0080485 A1 | 6/2002 | Suzuki et al. |
| 2002/0176166 A1 | 11/2002 | Schuster |
| 2003/0227669 A1 | 12/2003 | Volke et al. |
| 2004/0057036 A1 | 3/2004 | Kawashima et al. |
| 2004/0105150 A1 | 6/2004 | Yatsu et al. |
| 2004/0169924 A1 | 9/2004 | Flagello et al. |
| 2005/0134825 A1 | 6/2005 | Schuster |
| 2006/0055834 A1 | 3/2006 | Tanitsu et al. |

FOREIGN PATENT DOCUMENTS

| | | |
|---|---|---|
| DE | 195 20 563 A1 | 12/1996 |
| DE | 195 35 392 | 3/1997 |
| DE | 199 12 464 | 9/1999 |
| DE | 199 21 795 | 11/2000 |
| DE | 100 20 458 | 3/2001 |
| DE | 102 27 393 A1 | 12/2003 |
| EP | 0 588 937 B1 | 8/1996 |
| EP | 0823662 | 11/1998 |
| EP | 1 122 608 | 8/2001 |
| EP | 1 235 112 | 8/2006 |
| JP | 62-249107 | 10/1987 |
| JP | 05181135 | 7/1993 |
| JP | 2001-042432 | 2/2001 |
| JP | 2003/084133 | 9/2001 |
| JP | 2001-311912 | 11/2001 |
| JP | 2001-343611 | 12/2001 |
| WO | 97/11411 | 3/1997 |
| WO | 03/067334 | 8/2003 |

OTHER PUBLICATIONS

Tamada et al., "Al Wire-gird Ploarizer Using the S-polarization resonace effect at the 0.8-μm-wavelength Band" Optical Society of America, vol. 22, No. 6, pp. 419-421, Mar. 15, 1997.

Tyan et al., "Polarizing Beam Splitters Constructed of Form-Birefringent Multilayer Gratings", Department of Electrical and Computer Engineering, University of California at San Diego, La Jolla, CA. 92093.

Tyan et al., "Design, Fabrication, and Characterization of Form-Birefringent Multilayer Polarizing Beam Splitter", Optical Society of America, vol. 14, No. 7, pp. 1627-1636, Jul. 1997.

International Search Report received for International Application No. PCT/EP2004/008892.

* cited by examiner

ILLUMINATION SYSTEM AND POLARIZER FOR A MICROLITHOGRAPHIC PROJECTION EXPOSURE APPARATUS

CROSS-REFERENCE TO RELATED APPLICATIONS

This application is a continuation of International Application PCT/EP2004/008892 having an international filing date of Aug. 9, 2004 and claiming priority of International Application PCT/EP03/09017, filed Aug. 14, 2003. The full disclosures of both International Applications are incorporated herein by reference.

BACKGROUND OF THE INVENTION

1. Field of the Invention

The invention relates to an illumination system for a microlithographic projection exposure apparatus and in particular to an illumination system that comprises a polarizer. The invention further relates to polarizers suitable for such illumination systems.

2. Description of the Related Art

Integrated electrical circuits and other microstructured components are usually manufactured by applying a plurality of structured layers to a suitable substrate which may be, for example, a silicon wafer. In order to structure the layers they are first covered with a resist which is sensitive to light of a given wavelength range, e.g. light in the deep ultraviolet (DUV) spectral range. The wafer coated in this way is then exposed in a projection exposure apparatus. A pattern of diffractive structures arranged on a reticle is imaged on the resist by means of a projection lens. Because the imaging scale is generally less than 1:1, such projection lenses are frequently also referred to as reduction lenses.

After the resist has been developed, the wafer is subjected to an etching process whereby the layer is structured according to the pattern contained in the reticle. The remaining resist is then removed from the remaining parts of the layer. This process is repeated until all the layers have been applied to the wafer.

In important part of a projection exposure apparatus used for the exposure is an illumination system which generates a projection light beam and directs it onto the reticle. The illumination system generally includes a laser as a light source that generates linearly polarized light. Especially with the use of very short-wave projection light (e.g. $\lambda=157$ nm), however, undesired polarization-dependent effects which disturb the imaging properties of the projection lens may occur with certain optical elements. An example of such disturbing factors is the intrinsic birefringence of calcium fluoride ($CaF_2$), which has a significantly higher transparency than usual lens materials such as quartz glass at these short wavelengths and therefore partially or even wholly replaces these materials.

In order to reduce such polarization-dependent effects, additional methods are provided in some projection exposure apparatuses of this kind. For example, the linearly polarized projection light generated by the laser may be converted into circularly polarized light or even into unpolarized light, as is described in U.S. Pat. No. 6,535,273.

U.S. Pat. No. 6,191,880 discloses an illumination system including a masking objective, referred to generally in that document as a relay and field optical system, and a polarizer which converts the polarization direction of incident linearly and homogeneously polarized light into radially polarized light practically without loss. For this purpose the polarizer includes a plurality of hexagonal birefringent elements which form a honeycomb arrangement and ensure the radial polarization state through position-dependent rotation of the polarization direction. The radial polarization has the advantage that disturbances resulting from polarization-dependent reflections on the light-sensitive layer to be exposed are reduced.

However, in projection exposure apparatuses whose projection lenses comprise a beam-splitter cube having a polarization-selective beam splitting layer, it may be advantageous to direct linearly and homogeneously polarized projection light on the beam splitting layer. This allows to keep light losses at the beam splitting layer low. It has also been found that in certain cases, e.g. when projecting reticles containing particularly fine structures, the use of polarized light produces higher contrast in the image of the reticle. For this reason one often attempts to preserve the linear polarization state produced by the laser in the illumination system as good as possible. This entails that disturbances of the polarization distribution which may be caused, for example, by birefringence, have to be reduced. However, the complexity and cost associated with such a reduction are relatively high.

From U.S. Pat. No. 5,815,247 an illumination system for a projection exposure apparatus is known which includes an aperture plate which is rotatable about the optical axis. The aperture plate includes two pairs of apertures which are filled by polarization filters in the form of polarizing films. The two pairs differ in the orientation of the polarization filters. A further large-area polarization filter is arranged upstream of the aperture plate, relative to which polarization filter the polarization filters in the apertures can be aligned. With this known arrangement, different pairs of apertures are used for successive exposures.

U.S. Pat. No. 5,748,369 discloses a polarization-selective beam splitter for use in liquid-crystal projectors. The polarization-selective beam splitter consists of thin glass plates provided on both sides with polarization-selective beam splitting layers. The glass plates are arranged one behind the other in a staggered formation in the propagation direction of the light.

SUMMARY OF THE INVENTION

It is therefore an object of the present invention to provide an illumination system for a microlithographic projection exposure apparatus that allows to direct linearly polarized light onto a reticle even if projection light having a very short wavelength, e.g. 193 nm or 153 nm, is used.

This object is achieved with by an illumination system comprising:
  a light source for generating projection light,
  a masking arrangement for masking a reticle,
  a masking objective for imaging the masking arrangement on the reticle, and
  a polarizer that is arranged in the masking objective and polarizes transiting projection light linearly in at least one direction.

Because the polarizer is arranged in the masking objective, the projection light polarized linearly by the polarizer passes through only very few optical elements before impinging on the reticle. This ensures in a simple manner that, despite possible preceding disturbances of the polarization distribution, the projection light is almost completely linearly polarized when it impinges onto the reticle.

In principle, all optical components that allow to generate linearly polarized light can be used as polarizers in the context of the invention. However, many polarizers widely used in optical systems, e.g. conventional dichroic crystals or organically dyed films, are not usable for an application in illumination systems producing projection light having a wavelength in the deep ultraviolet (DUV) spectral range.

New types of wire polarizers, as described in an essay by H. Tamada et al. entitled "Al wire-grid polarizer using the s-polarization resonance effect at the 0.8-µm wavelength band", Optics Letters, Vol. 22, No. 6, 1997, pages 419-420, should not be subject to this restriction, at least in principle. The full disclosure of this essay is incorporated herein by reference.

Other polarizers which may be considered are form-birefringent gratings as described, for example, in an essay by M. Schmitz et al. entitled "Gratings in the resonance domain as polarizing beam splitters", Optics Letters, Vol. 20, No. 17, 1995. The full disclosure of this essay is incorporated herein by reference. In such gratings, the distance between grating structures is of the order of magnitude of the light wavelength. The orders of diffraction generated by the grating are polarized linearly in different directions. If the grating is designed so that the diffraction orders differing from zero are radiated from the grating at such large angles that they are directed out of the beam path, only the $0^{th}$ diffraction order, which is linearly polarized to a high degree, remains. One advantage of such form-birefringent gratings is that they allow to realize a very flat design of the polarizer. They are therefore particularly suited to be inserted into the beam path when required by being pushed into a filter insert.

In an particularly advantageous embodiment, a form-birefringent grating of this kind contains grating structures that each include a plurality of dielectric layers arranged parallel to a grating plane and one above another. Such gratings, in which, in addition to the form birefringence, resonance effects occur in multilayer systems, are described, for example, in two essays by R.-C. Tyan et al. entitled "Polarizing beam splitters constructed of form-birefringent multilayer gratings", SPIE Proceedings: Diffractive and Holographic Optics Technology III, Vol. 2689, pages 82-89, 1996 and "Design, fabrication, and characterization of form-birefringent multilayer polarizing beam splitter", J. Opt. Soc. Am A, Vol. 14, No. 7, 1997, pages 1627-1636.

One advantage of these form-birefringent gratings constructed from multilayer systems is that with these polarizers the degree of polarization depends only relatively slightly on the angle of incidence. This property is important in illumination systems of projection exposure apparatuses because the angular distribution of the projection light transiting the polarizer covers a range of typically 0° to 10°.

Also suitable for an arrangement in a masking objective of an illumination system are dichroic glass polarizers as described, for example, in US Pat. Appln. 2003/0227669 A1. These dichroic glass polarizers, too, have the advantage that they have small extension in the direction of the optical axis and therefore are well suited to being accommodated exchangeably in a filter holder.

Polarization-selective beam splitting layers which are commercially available in numerous configurations, e.g. as thin-film polarizers, are also suitable as polarizers for short-wave projection light. These beam splitting layers are layered structures which have the property of being transparent to impinging light in a first polarization state and reflective to light in a second polarization state differing from the first polarization state. However, the difference of transmittance for the different polarization states is dependent on the angle at which the light impinges on the beam splitting layer. The commercially available beam splitting layers therefore differ not only with regard to the wavelength for which the layer is designed, but also with regard to factors including the angle at which the polarizing effect is at a maximum. Because no practically manufacturable beam splitting layers having a strong polarizing effect with both vertical and oblique light incidence have existed up to now, a beam splitting layer must be arranged in an illumination system at an angle to a plane which is disposed perpendicularly to the optical axis of the masking objective.

The polarization-selective beam splitting cubes used in catadioptric projection lenses of projection exposure apparatuses, in which a polarization-selective layer is arranged between two prisms, make use of this principle. However, these beam splitting cubes have, primarily because of their size, only limited suitability for installation in a masking objective.

In a first embodiment of the invention a polarizer is used which comprises a plurality of polarizer elements each of which includes two polarization-selective beam splitting layers arranged at an angle to one another.

By combining a plurality of polarizer elements side-by-side, a polarizer of this kind may have an almost continuous entry face, which can be covered almost completely with polarization-selective beam splitting layers. The totality of the light impinging on the entry face can thereby be utilised, even if it does not impinge on the polarizer perpendicularly. Above all, however, such a polarizer is so flat that it can be positioned without difficulty inside the masking objective and therefore close to the end of the illumination system on the exit side. In addition, a polarizer of such thin construction can be exchanged without difficulty for a transparent plate in case a linear polarization of the projection light is not required.

Moreover, such a polarizer is not only usable in conjunction with the arrangement inside the masking objective, but can be used advantageously in illumination systems of microlithographic projection exposure apparatuses quite generally.

A similarly constructed polarizer which, however, is not provided for an illumination system of a microlithographic projection exposure apparatus but for installation in a UV light source for drying liquid crystals, is known from US Pat. Appln. 2002/0080485 A1.

Because the polarization-selective effect of the beam splitting layers depends on the angle of incidence, the beam splitting layers should include between them an angle of between 80° and 160° in a symmetrical arrangement with respect to the aforementioned plane which is disposed perpendicularly to the optical axis of the masking objective. In the case of light incident perpendicularly to the polarizer plane this corresponds to angles of incidence on the beam splitting layers of 40° to 80°. This selection takes account of the fact that in most polarization-selective beam splitting layers the angle with greatest polarization selectivity is between approximately 55° and 70°. In case of deviations of the angle of incidence from this angle by 15° to 20°, relatively high polarization efficiency is still achieved.

It is particularly preferred if the angle between the beam splitting layers is from 90° to 120°. With this choice of angle the polarization efficiency of the polarization-selective beam splitting layers is particularly high.

With regard to design, it is particularly simple if the angle between the beam splitting layers is exactly 90°. The reflected polarization component is then reflected back precisely against the direction of incidence. However, in the illumination systems of microlithographic projection exposure apparatuses it is generally disadvantageous if the reflected polarization component is directed back into the laser. Especially in the case of beam splitting layers arranged at 90° to one another, therefore, it is preferred if at least one scattering element is so arranged between the two beam splitting layers that light reflected by one beam splitting layer passes through the scattering element and is scattered therein before it impinges on the other beam splitting layer.

The scattering element may be, for example, a frosted surface which has the effect that re-reflected light is sent back diffusely against the direction of incidence. Components located outside the beam path, such as lens mounts or the like, are then exposed only to light of relatively low intensity.

If a grating structure is used as the scattering element, however, the scattering can be very precisely influenced, making it possible to direct the reflected light in a targeted manner to specific areas outside the beam path.

The polarization elements according to the invention may be realized, for example, as elongated quartz cubes which have a recess in the shape of a wedge prism and a wedge prism exactly fitted therein. The beam splitting layer is then arranged on the boundary surface between the two above-mentioned components.

In particular for technical manufacturing reasons, however, it is preferred if the polarization elements each include two parts, each part carrying a beam splitting layer. In this way the beam splitting layers can be applied to perfectly flat surfaces, the angle between the beam splitting layers resulting from the joining of two individual parts.

In a further embodiment based on this configuration each part includes at least two (wedge) prisms located one upon the other, between which a beam splitting layer is arranged. A large-area polarizer of uniform thickness, with beam splitter layers forming an angle to one another arranged therein, can thereby be realized in an particularly simple manner.

The prisms may be, for example, brought together by optical contacting. However, especially in the case of relatively small prisms such optical contacting is often difficult, so that the efficiency can be low. In an advantageous embodiment, therefore, the prisms are arranged at a distance from one another so that a narrow gap remains between the prisms. This gap is filled with a liquid, e.g. water, reducing the refractive index quotient at the boundary surfaces.

If the prisms are wedge prisms, they may be arranged with respect to one another in such a way that each part has in cross section substantially the form of a parallelogram, a rectangle or, in particular, a square.

To improve the strength and ease of handling of the individual prisms, one of the prisms of each part may be supported by a support plate—preferably formed in one piece therewith—which is transparent to the incident light.

If this support plate has, for example, a projecting length in a transverse direction on at least one side of the prism supported thereby, the support plates of a plurality of parts may be so arranged in the polarizer that they are in flush abutment to one another along their long sides. A gap then remains between the prisms of adjacent parts. Such a gap has the advantage that in this way no forces act during assembly on the fragile prisms. Such forces cause, for example, shearing off of individual prisms.

Another possible approach of creating such a gap between the prisms of adjacent parts is to provide within a single part two or more prisms having inclined boundary faces between which the beam splitting layer of the part concerned is arranged and which have different dimensions in the transverse direction. This makes it possible to displace the prism having the smaller boundary face on the boundary face of the other prism in such a way that, when a plurality of parts are joined together, only the prisms with the larger boundary faces, or support plates attached thereto, touch one another, while a gap remains in each case between the prisms having the smaller boundary faces. The gap should, however, be as narrow as possible to keep light losses at the gaps low.

Because of the narrow gaps between the parts, a previously entirely homogenous light beam takes on a fine screening after passing through the polarizer. If, however, as is frequently the case, the illumination system has a light mixing element, e.g. a honeycomb condenser or a rod homogenizer, which generates a periodic distribution of intensity in a pupil plane in which the polarizer is preferably arranged, the influence of the narrow gaps between the parts becomes negligible if the width of the support plates in the transverse direction is equal to an integral fraction or an integral multiple of the period of the intensity distribution.

If the support plate has a projecting length in a longitudinal direction on at least one side of the prism carried thereby, said projecting length may be used to fix the individual polarizer elements on an assembly plate. If the assembly plate has, for example, a preferably rectangular opening above which the polarizer elements are arranged side-by-side, and if two rails are arranged along two opposite edges of the opening, the projecting lengths of the support plates can be inserted in the longitudinal direction under these rails.

In another embodiment of the invention the polarizer still includes a polarization-selective beam splitting layer but the latter is not arranged on or between prisms. Instead, a plurality of plane-parallel supporting elements is used supporting the polarization-selective beam splitting layer. Each supporting element supports a beam splitting layer and is arranged obliquely with respect to an incidence direction which the projection light impinging on the beam splitting layer has as its mean. This is usually, but not always, a plane in which longitudinal axes of symmetry of the supporting elements lie.

Plate-like supporting elements of this kind can be assembled particularly simply to form a planar polarizer which can have practically any desired extension in a plane, or a curved surface, while being of very low overall height. The greater the number of supporting elements, the lower the overall height. For this reason a polarizer constructed in this way is particularly well-suited to being arranged in a pupil plane of a masking objective.

The supporting elements may be plates in the form of elongated rectangles. The short transverse sides of such plates may be inserted, for example, in corresponding grooves which are formed in retaining structures arranged outside the light path. However, the supporting elements may also be attached to such retaining structures, with the required inclination to the incidence direction, in any other way. Particularly in the case of very thin and elongated supporting elements it is possible, for example, to support them on a continuous surface located in the light path, which surface may be, for example, a plane-parallel plate or a lens surface.

Very favorable characteristics are produced if the plane-parallel supporting elements are arranged with reciprocal inclinations, so that the polarizer is given a sawtooth cross-section.

Independently of the type of arrangement selected, the supporting elements should be very thin, so that their refractive effect is as small as possible. Therefore the thickness of the supporting elements may be less than 5 mm, preferably less than 1.5 mm and more preferably less than 0.75 mm.

In view of achieving maximum and angle-independent polarization, the angle to be set between the normals on the supporting elements and the given incidence direction depends critically on the beam splitting layer used. Beam splitting layers for which this angle is relatively large, so that the light must impinge steeply on the beam splitting layers, frequently have an particularly high polarizing effect. The angle may be, for example, between 60° and 75° and preferably between 65° and 70°.

Although it is not essential that all the supporting elements are arranged at the same angle to the incidence direction, for the purpose of achieving a most uniform polarizing effect the supporting elements may be arranged such that their normals include at least approximately the same angle with the given incidence direction. In certain cases, e.g. with curved pupil surfaces, the incidence direction may depend on the distance of the point of impingement from the optical axis. The requirement for equal angles between the normals on the supporting elements and the respective incidence directions then gives rise to an arrangement in which the supporting elements are increasingly tilted with respect to the optical axis the greater the distance of the respective beam splitting layer from the optical axis is.

Because the deviations of the incidence direction from the optical axis can easily be within a range of several degrees, e.g. between 1° and 4°, it follows that the supporting elements are no longer located in a plane but in a curved surface.

Because, however, the pupil plane is frequently not completely illuminated, but is transited by projection light only in zones separated from one another, the possibility exists to retain the supporting elements, or groups of supporting elements having the same inclination, in this curved arrangement by means of retaining structures located in the unilluminated zones of the pupil. If, as mentioned above, the supporting elements are fixed to a carrier plate, there is also the possibility of bending the entire carrier plate in the desired manner in such a way as to match a curved pupil surface.

With regard to the operation of the beam splitting layers, it is immaterial to which side of the supporting elements the layers are attached. However, the use of thin plane-parallel supporting elements has the advantage that beam splitting layers can be applied to both sides of the supporting elements. Both layers then are, because of the plane-parallel arrangement, automatically oriented optimally with respect to the incidence direction of the projection light. The polarizing effect produced by supporting elements covered on both sides with beam splitting layers is self-evidently greater than that of supporting elements covered on only one side.

Under some circumstances it may, however, be advantageous to provide the supporting elements with a beam splitting layer on only one side and to apply an antireflection layer to the other side. Imagine a light ray that is first reflected by a beam splitting layer and then, due to a changed angle of incidence, transmitted by a neighboring beam splitting layer. In such a case an antireflection layer can prevent this light ray from being directed back into the beam path by reflection at the next but one beam splitting layer. The antireflection layer should therefore be so designed that the lowest possible reflectivity is achieved for the angles occurring on that layer.

If it is desired to increase the polarizing effect, which is to be considered, in particular, with the above-mentioned configuration in which the supporting elements carry only a single polarization-selective beam splitting layer, the possibility also exists, of course, to arrange at least two carrier plates one behind the other in the incidence direction in such a way that each light ray passes through the at least two carrier plates. Through such a staggered arrangement of two or more carrier plates one behind the other practically any degree of polarization can be achieved.

An alternative solution to the above-mentioned problem of unwanted rays reflected back into the beam path is to make end portions of the supporting elements located away from the reticle absorbent. In the arrangement of the supporting elements primarily under consideration here, in which they have changing angles of inclination, this alternative solution means, for example, that the longitudinal edges located away from the reticle, at which the longitudinal sides of adjacent supporting elements border one another at an angle, absorb projection light. The size of these end portions should be so determined that precisely those light rays which would otherwise pass through the neighboring beam splitting layer and would then be reflected back to the optical axis by the next but one beam splitting layer, are prevented from further propagation.

The simplest possibility of achieving absorption at these end portions is to cover the end portions with an absorbent layer. This layer may also be deposited on a beam splitting layer supported on a support element. The associated light losses are relatively small because the end portions have comparatively small areas.

According to another advantageous embodiment, the polarizer has a first plate formed in one piece and having a first and a second face extending substantially parallel to a plane, e.g. perpendicularly to the optical axis. Of these faces, at least the first face is subdivided into a plurality of partial faces which are arranged at an inclination to the plane and which carry the beam splitting layer. The polarizer further includes a second plate formed in one piece and having a further face extending substantially parallel to the plane. This face has the same form as the first face of the first plate and is oriented towards same. The second plate, the further face of which may also carry a beam splitting layer, has the primary function of compensating for the refraction at the first face by a further refraction in the opposite direction. In this way it is achieved that an incident light ray, although offset in a parallel manner, does not otherwise change its direction when passing through the polarizer.

The one-piece configuration of the plates has the advantage that the polarizer does not need to be composed of a large number of individual prism elements.

It is advantageous if the two plates are of such extension in the direction perpendicular to the optical axis that the entire impinging projection light beam can pass through both plates arranged one behind the other. Undesired light scatter at boundary surfaces, which can otherwise occur between neighboring elements, is reliably avoided in this way.

The two plates may be joined together by optical contacting so that the two plates are in direct contact with one another. However, the optical contacting of structured plates of large area requires very high manufacturing accuracy, because even the smallest air gaps can have an unfavorable effect on the optical characteristics. A further possibility is to fix the two plates at a distance from one another in such a way that the first face and the further face are separated by a gap the thickness of which is preferably constant.

To reduce or entirely prevent refraction at the first face of the first plate, the gap may be filled with a liquid. The smaller the difference between the refractive index of the liquid and the refractive index of the surrounding media, the smaller is the refraction. If the refraction is sufficiently small, it is no longer absolutely necessary for the gap filled with the liquid to have an at least approximately uniform thickness. This allows the use of, for example, a second plate the face of which orientated towards the first plate is not configured congruently to the first face of the first plate, but plane-parallel. As a result, the gap between the first plate and the second plate is not of uniform thickness.

For this reason, in an advantageous embodiment, the refractive index of the liquid differs, for the projection light used, from the refractive index of the first and second plates by not more than 0.1 and preferably not more than 0.01. The entire polarizer then behaves with respect to light refraction like a single homogeneous optical medium, which may have, for example, the form of a plane-parallel plate.

In another advantageous embodiment the two plates are not maintained at a distance by a suitable fixing device but are joined together by means of a thin liquid film. This film, which has a thickness of less than 0.1 mm and preferably less than 0.01 mm, is prevented from flowing away by adhesion forces, so that an external liquid supply and complex and costly sealing measures may optionally be dispensed with. In order to achieve that the liquid film fills the entire gap between the two plates, the two plates may be lightly loaded towards one another by means of a pressing device.

Independently of the actual configuration of a polarizer comprising beam splitting layers, it is preferred if the normals on all the beam splitting layers are located in a plane which extends through the optical axis and a direction in which the projection light has the smallest angular distribution in the pupil plane. In this way, in the case of asymmetrical angular distributions, a more symmetrical dependence of the degree of polarization on the angle of incidence is achieved.

The above-described alignment of the beam splitting layer is, of course, not always compatible with the desired polarization direction. This direction can, however, be simply obtained if the polarizer comprises a polarization-rotating element that changes the polarization state generated by the beam splitting layer to the desired polarization state. Such a polarization-rotating element may be arranged at a distance from the supporting elements. It is then only necessary to ensure that, in cases in which different polarizations are to be generated in the pupil plane, the projection light having already the desired polarization state will not be disturbed by the following polarization-rotating element.

If a plurality of polarizers having different polarization directions are arranged in a pupil plane, with two polarizers arranged point-symmetrically to the optical axis having in each case the same direction of polarization, the contrast of the structures imaged can thereby be further increased if the illumination system also includes means known as such for generating multipole illumination. With multipole illumination, the illumination of a pupil plane is restricted to a plurality, e.g. 2 or 4, of separate zones referred to as poles. Such a combination of a plurality of polarizers and multipole illumination permits the imaging of very fine structures with high contrast, wherein the direction of the structures is aligned along a polarization direction of the polarizers.

To be able to generate unpolarized projection light if required, the polarizer is preferably arranged exchangeably in a filter insert. It can then be exchanged, like a filter element, for a transparent plate without incurring major cost and complexity.

The polarizers described above can also be advantageously used independently of an illumination system.

BRIEF DESCRIPTION OF THE DRAWINGS

Further advantages and features of the invention will be apparent from the following description of preferred embodiments with reference to the drawings, in which.

DESCRIPTION OF PREFERRED EMBODIMENTS

Figure 1:
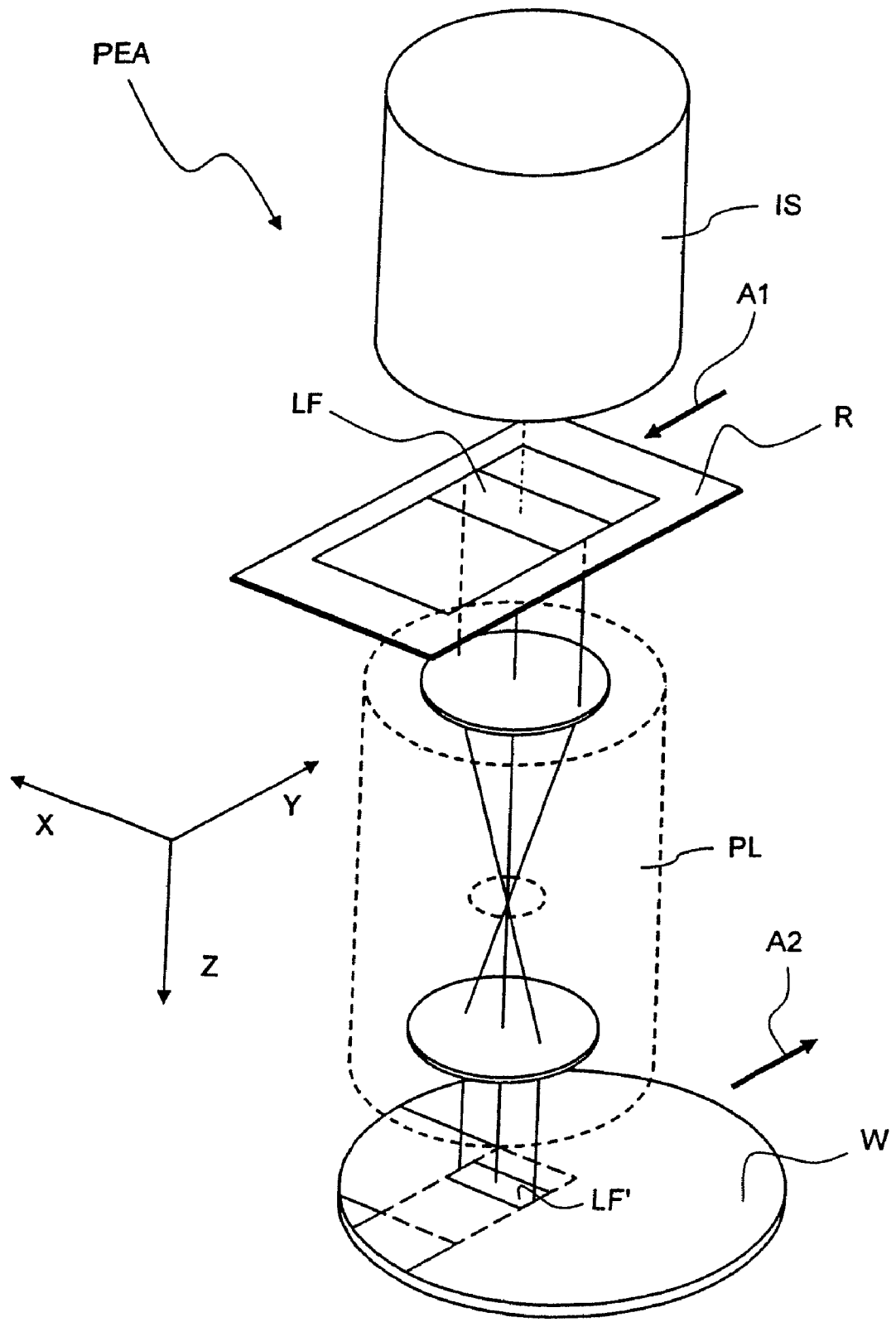
FIG. 1 is a schematic perspective representation of a microlithographic projection exposure apparatus.

FIG. 1 shows a projection exposure apparatus PEA, which is suitable for manufacturing microstructured components, in a highly schematized representation that is not to scale. The projection exposure apparatus PEA includes an illumination system IS for generating a projection light beam. This light beam illuminates a narrow light field LF, rectangular in the embodiment illustrated, on a reticle R containing structures to be projected. The structures of the reticle R located inside the light field LF are imaged by means of a projection lens PL on a light-sensitive layer which is applied to a wafer W and located in the image plane of the projection lens PL. Because the projection lens PL has an magnification of less than 1:1, a reduced image LF' of the zone LF is projected on the wafer W.

During projection the reticle R and the wafer W are displaced in a Y direction. The relation between the displacement velocities is equal to the magnification of the projection lens PL. If the projection lens PL inverts the image, the displacement movements of the reticle R and of the wafer W are in opposite directions, as is indicated in FIG. 1 by the arrows A1 and A2. In this way the light field LF is moved across the reticle R in a scanning movement, so that structured zones larger than the zone LF can be projected continuously on the wafer W. The Y direction is therefore also referred to hereinafter as the scanning direction.

Figure 2:
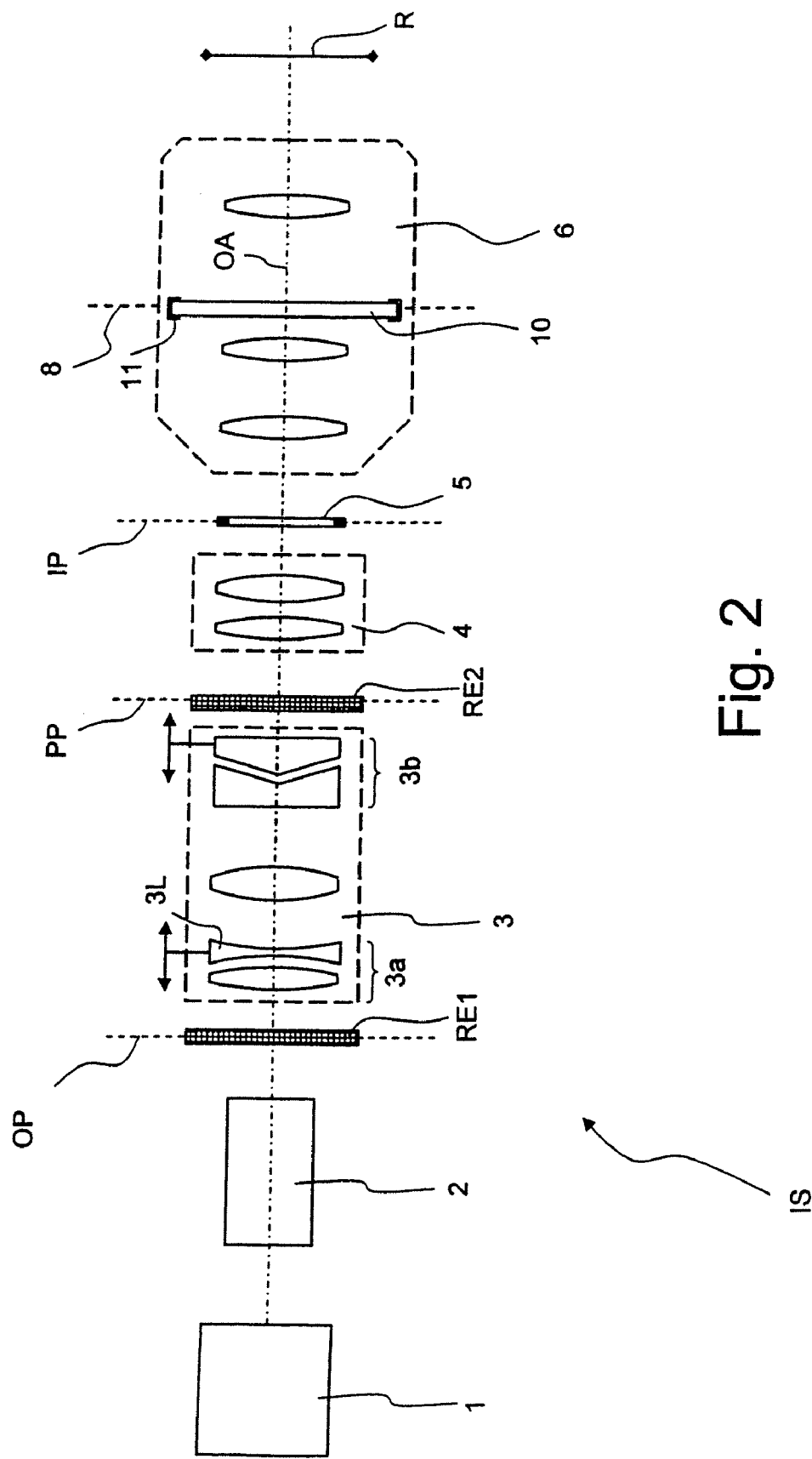
FIG. 2 is a schematic representation of an illumination system according to the invention for the projection exposure apparatus shown in FIG. 1, having a polarizer arranged in a masking objective.

FIG. 2 shows in a simplified meridional section, which is not to scale, the illumination system IS illustrated in FIG. 1. A light source 1, e.g. in the form of an excimer laser, generates monochromatic and strongly collimated light having a wavelength in the deep ultraviolet (DUV) spectral range, e.g. 193 nm or 157 nm.

In a beam expander 2, which may be e.g. an adjustable mirror arrangement, the light generated by the light source 1 is expanded to form a rectangular and substantially parallel ray bundle. The expanded ray bundle then passes through a first optical raster element RE1, which may be realized as a diffractive optical element or a micro-lens array.

Further examples of suitable raster elements can be found in U.S. Pat. No. 6,285,443, whose full disclosure is incorporated herein by reference. The first optical raster element RE1 has the function of changing the illumination angle distribution of the projection light and of increasing the light-conductance value, which is also frequently referred to as the geometrical optical flux.

The first optical raster element RE1 is arranged in an object plane OP of a beam shaping lens 3 with which the illumination angle distribution can be further modified and continuously changed. For this purpose the beam shaping lens 3 contains a zoom group 3a comprising at least one adjustable lens 3L and an axicon group 3b. The axicon group 3b includes two axicon elements with conical faces, the distance between which is variable.

A second optical raster element RE2 is arranged in a pupil plane PP, which is the exit pupil of the beam shaping lens 3. The second optical raster element RE2 has the function of determining the intensity distribution of a downstream conjugate field plane.

Behind the second optical raster element RE2 in the light propagation direction, there is arranged a second objective 4 having an image plane IP. In this image plane IP a reticle masking arrangement 5 known as such (so-called REMA diaphragm) is located. The masking arrangement 5 may include adjustable blades and determines the shapes of the zone LF on the reticle R. To obtain a sharp boundary of the zone LF, there is provided a third objective 6, referred to here as the masking objective. The adjustable blades of the masking arrangement 5 are located in an object plane and the reticle R is positioned in an image plane of the masking objective 6.

If required, a glass rod for beam homogenization may be inserted between the second objective 4 and the masking arrangement 5, as is described in U.S. Pat. No. 6,285,443 already mentioned.

In a pupil plane 8 of the masking objective 6 a polarizer 10 for generating linearly polarized light is inserted in a filter holder 11. Various embodiments of the polarizer 10 are elucidated below with reference to the remaining Figures.

First Embodiment

Figure 3:
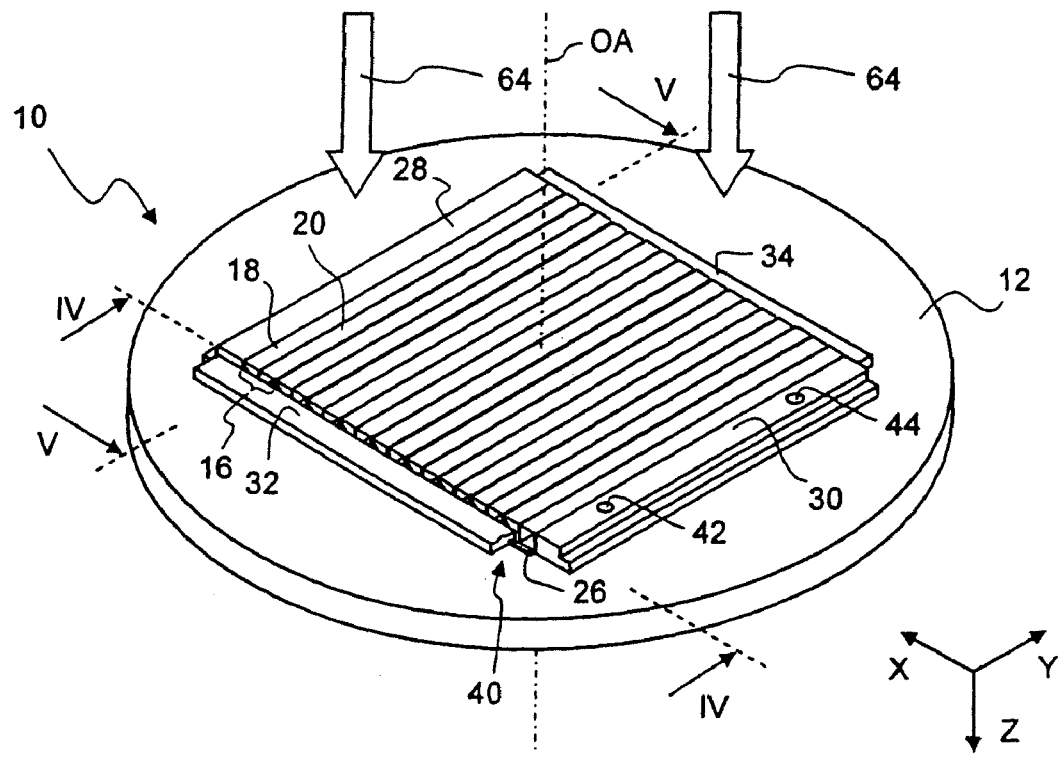
FIG. 3 is a perspective view of a polarizer according to a first embodiment of the invention, which is suitable for the illumination system shown in FIG. 2.
Figure 4:
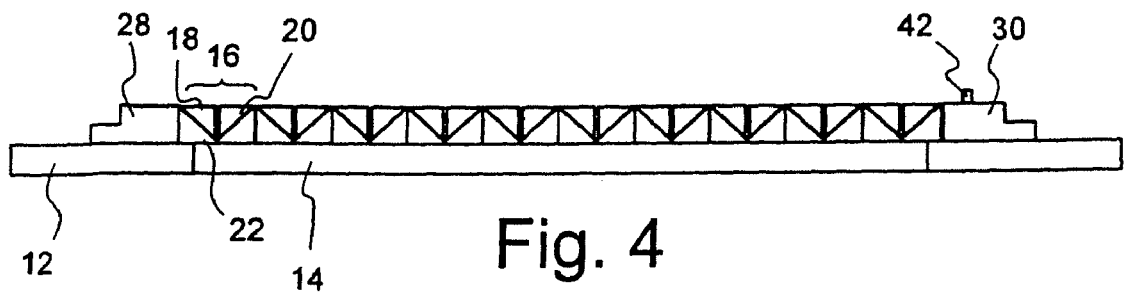
FIG. 4 is an enlarged sectional representation of the polarizer shown in FIG. 3 along the line IV-IV.
Figure 5:
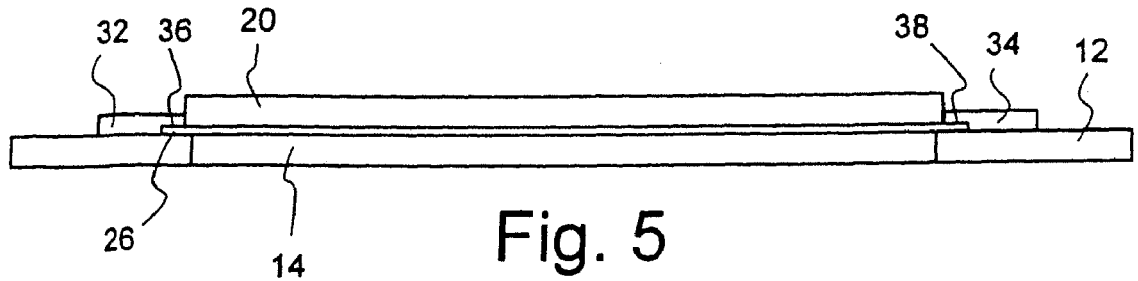
FIG. 5 is an enlarged sectional view of the polarizer shown in FIG. 3 along the line V-V.

FIG. 3 shows the polarizer 10 in a perspective representation. The following description of the polarizer 10 also relates to the sections along the lines IV-IV and V-V, which are shown in FIGS. 4 and 5 respectively. The polarizer 10 has a circular assembly plate 12 which is provided with a central rectangular opening 14 and can be introduced into the optical beam path, e.g. by insertion in the filter holder 11 (see FIG. 2). A multiplicity of polarizer elements 16, each consisting of a pair of parts 18 and 20, extend across this opening 14. The parts 18, 20, the construction of which is explained in more detail below with reference to FIG. 6, have the form of elongated cuboids and each include a support plate 22 which has a projecting length 26 in the longitudinal direction Y.

The arrangement of polarizer elements 16 is bordered laterally in the X direction by two stops 28 and 30, against which the support plates 22 of adjacent parts abut. The stop 30 is fixed detachably to the assembly plate 12 by means of two fixing elements 42, 44.

The polarizer elements 16 are fixed in the Y and Z directions by two rails 32 and 34 which have respective recesses 36, 38 facing towards the opening 14. These recesses 36, 38 receive the projecting lengths 26 of the support plates 22. This can be seen particularly clearly in FIG. 5 and also in FIG. 3 at the location marked 40, from which a part of the rail 32 has been removed for clarity.

During assembly of the polarizer 10, the projecting lengths 26 of the individual parts 18, 20 of the polarizer elements 16 are inserted successively, with the stop 30 removed, under the rails 32, 34. The first part inserted in the X direction is aligned by the stop 28 located opposite the point of insertion. When all the parts 18, 20 have been inserted, the other stop 30 is fixed to the assembly plate 12 by means of the fixing elements 42, 44.

The construction of the polarizer elements 16 and the operation of the polarizer 10 are elucidated in detail below with reference to FIG. 6, which shows one of the polarizer elements 16 in an enlarged section from FIG. 4.

The two parts 18, 20 each have two right-angled wedge prisms 46, 48 and 50, 52 respectively which rest against one another along their hypotenuse faces. In the embodiment illustrated the support plates 22 are formed in one piece with side faces of the wedge prisms 46 and 50 which are oriented downwardly in FIG. 6, so that these elements, strictly speaking, are no longer exactly wedge-shaped. It is, however, self-evident that the support plates 22 may also be separate parts on which the wedge prisms 46, 50 are fixed; the wedge prisms 46, 50 would then be exactly wedge-shaped in cross-section.

Arranged between the two abutting hypotenuse faces of the wedge prisms 46, 48 and 50, 52 are respective polarization-selective beam splitting layers 54, 56, which are applied in known fashion to one of the two hypotenuse faces before the two wedge prisms 46, 48 and 50, 52 are joined together.

Figure 6:
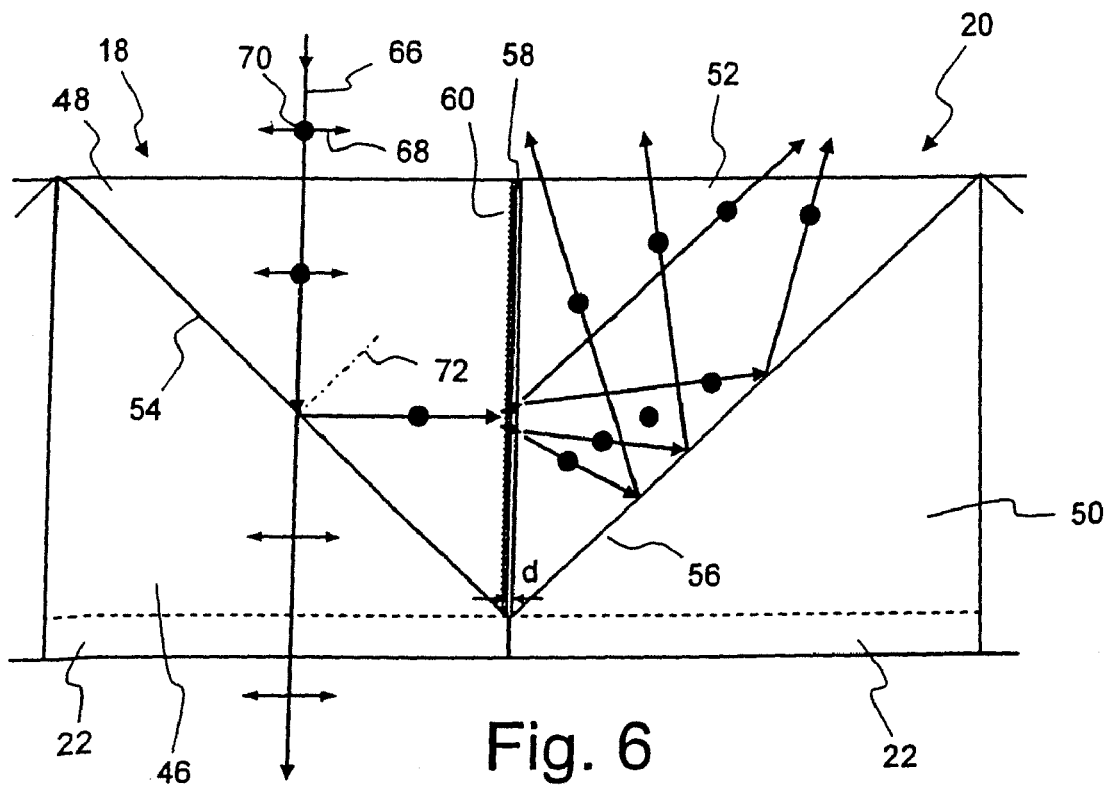
FIG. 6 shows an enlarged portion from the sectional representation of FIG. 4.

The two wedge prisms 48 and 52 facing upwardly in FIG. 6 are slightly smaller than the two downwardly facing wedge prisms 50 and 54. In this way a gap 58 of width d, which is shown exaggeratedly wide in the drawing for reasons of greater clarity, is produced between neighboring wedge prisms 48, 52 of a polarizer element 16. The wedge prism 48 of the part 18 has on its face oriented towards the gap 58 a grating structure 60, which can be produced, for example, by diamond milling.

If light falls perpendicularly on the polarizer 10 in the direction indicated by arrows 64 in FIG. 3, light in one polarization state is predominantly transmitted by the polarizer 10, while light in the polarization state perpendicular thereto is predominantly reflected back against the incidence direction 64. For clarification, a single light ray 66 which impinges on the part 18 in the incidence direction 64 of the polarizer 10 is marked in FIG. 6. The light ray 66 is unpolarized and therefore contains, firstly, a polarization component indicated by arrows 68 and referred to as the p-component, in which the oscillation direction of the electrical field is disposed parallel to the plane of incidence. This latter term refers to the plane in which both the incidence direction of the light ray 66 and the surface normals, designated 72, of the beam splitting layer 54 are located; in the representation of FIG. 6, therefore, the plane of incidence corresponds to the paper plane. In addition to the p-component, the incident unpolarized ray also contains a polarization component indicated by dots 70 and referred to as the s-component, in which the oscillation direction of the electrical field is disposed perpendicularly to the plane of incidence.

The beam splitting layer 54 is so designed that the p-component of the incident ray 66 can pass through the beam splitting layer 54 while almost 100% of the s-component is reflected back. Because the two beam splitting layers 54 and 56 are arranged symmetrically with respect to the X-Y plane defined by the arrangement of the polarizer elements 16, and at an angle of approximately 90° to one another, the ray 66 impinges on the beam splitting layer 54 at an angle of 45°, so that the s-component 70 is reflected at 90° and is directed to the other part 20. On its path thereto the s-component 70 first passes through the grating 60, where it is scattered at an angle of a few degrees, e.g. 5° or 10°. The now expanded beam of the s-component enters the wedge prism 52 of the adjacent part 20, is reflected approximately 100% at the second beam splitting layer 56 of the part 20, returned substantially against the incidence direction 64 and directed out of the beam path.

Although a small light loss results from the gap 58 between the two parts 18 and 20, the generation of shear forces between the respective upper wedge prisms 48 and 52 of the two parts 18 and 20 is prevented in this way. Especially during assembly of the polarizer 10, such shear forces can damage the parts 18, 20 and, in particular, the polarization-selective beam splitting layers 54, 56 located between the wedge prisms 46, 48 and 50, 52.

The light losses resulting from the gap 58 remaining between the parts 18, 20 are not of major importance if the width of the support plates 22 in the X direction is so designed that it represents either an integral fraction or an integral multiple of a pupil raster structure which is pre-sent in any case. Such a pupil raster structure may result, for example, from the use a fly-eye lens 9 (see FIG. 2) in the preceding beam path.

Moreover, the above situation also applies if the individual polarization elements 16 abut one another without gaps, since even then small light losses are unavoidable at the boundary faces between adjacent polarizer elements. By adapting the geometry of the polarization elements to an existing pupil raster structure, the negative effects of such unavoidable light chinks on illumination homogeneity and telecentricity can be minimized.

Figure 7:
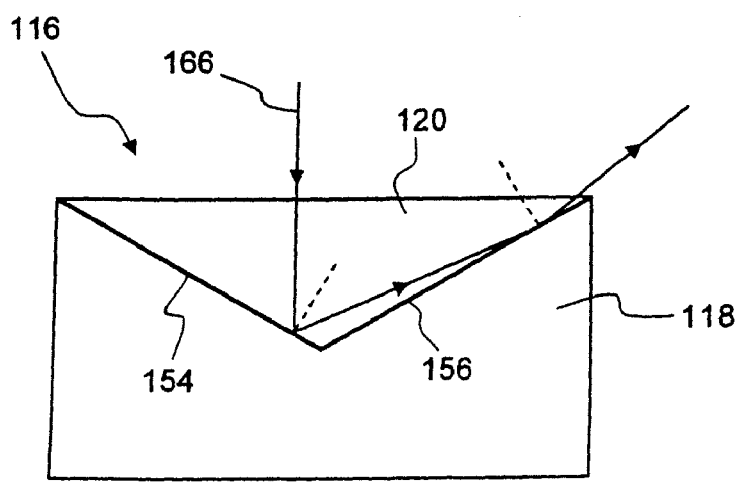
FIG. 7 is a simplified sectional representation corresponding to FIG. 6 of a polarizer according to a variant of the first embodiment.

FIG. 7 shows in a lateral section another configuration for polarizer elements 116, which may be used in place of the polarizer elements 16 in the polarizer 10.

The polarizer element 116 shown in FIG. 7 differs from that shown in FIG. 6 in particular in that it is not divided into two individual parts. Instead, the polarizer element 116 consists of a cuboid 118 elongated in the Y direction which has a wedge-shaped recess in its upper face. A wedge prism 120 is positioned with an exact fit in this recess, polarization-selective beam splitting layers 154 and 156 being applied to the boundary faces between the cuboid 118 and the wedge prism 120. Because the wedge prism 120 is formed in one piece, there is no possibility in this embodiment of arranging a ground glass screen or other scattering element between the two beam splitting layers 154 and 156.

Back-reflection of the incident light 166 which deviates from the incidence direction is achieved in this embodiment in that the two beam splitting layers 154 and 156 include an angle of more than 90°. In this way the ray 166 incident in the incidence direction 64 and impinging perpendicularly on the polarizer, as illustrated in FIG. 7, is directed laterally out of the beam.

Second Embodiment

A second embodiment of a polarizer which is also suitable for insertion in the pupil plane 8 of the masking objective 6, an example of which is shown in FIG. 2, is elucidated below. Parts which are also present identically or correspondingly in the polarizer 10 are designated by reference numbers increased by 200.

Figure 8:
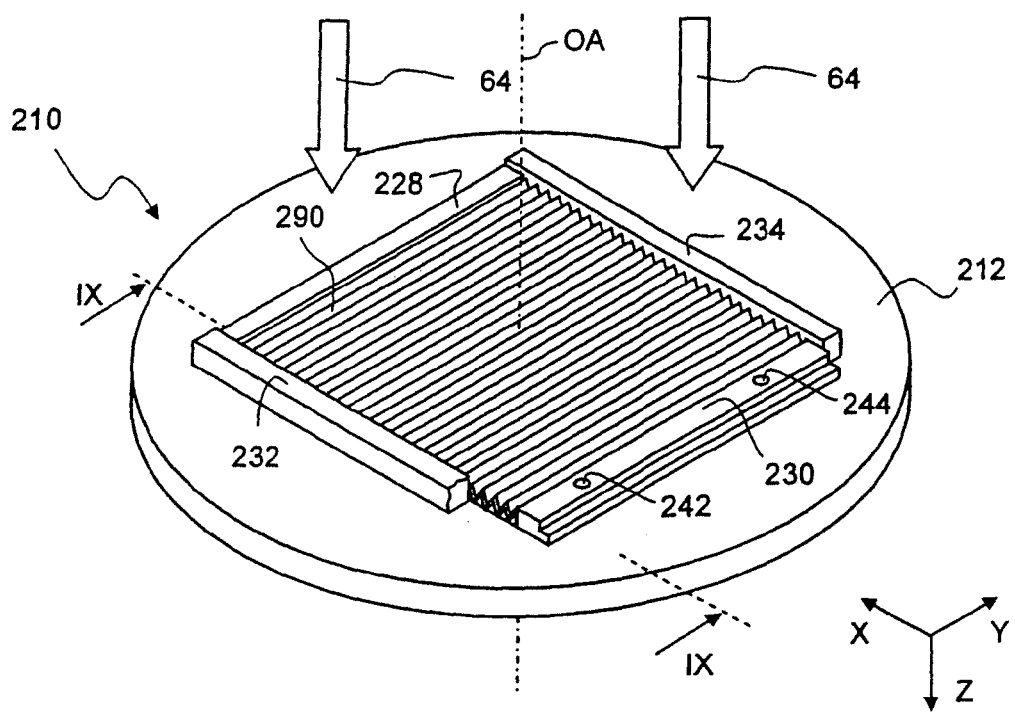
FIG. 8 is a perspective view of a polarizer according to a second embodiment of the invention, which is also suitable for the illumination system shown in FIG. 2.
Figure 9:
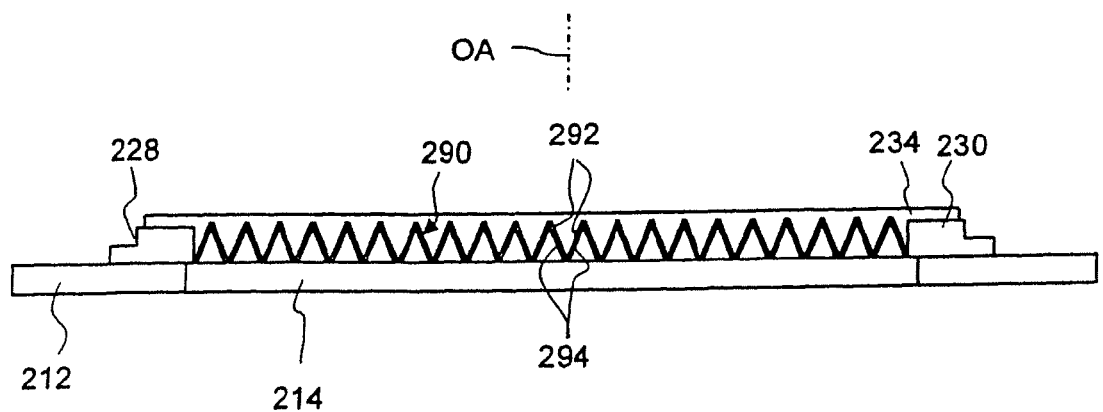
FIG. 9 is an enlarged sectional representation of the polarizer shown in FIG. 8 along the line IX-IX.

FIGS. 8 and 9 show a polarizer 210 according to the second embodiment in a perspective view and in a horizontal section along the line IX-IX respectively. The polarizer 210 also has a circular assembly plate 212 which is provided with a central rectangular opening 214 and can be introduced into the optical beam path, e.g. by insertion into a filter holder 11, as shown in FIG. 2. The filter holder 11 may be so constructed that the polarizer 210 can be inserted in different angular positions or can be rotated through any desired angle about the optical axis. In this way different polarization directions can be set.

A multiplicity of supporting elements 290 consisting of thin plane-parallel quartz glass plates and having the form of elongated rectangles in the Y direction extend across the opening 214. Each supporting element 290 supports on its upper and lower face a respective polarization-selective beam splitting layer 292, 294, as is explained in more detail below with reference to FIG. 11.

The arrangement of supporting elements 290 is limited in the X direction by two stops 228 and 230. The stop 230 is fixed detachably to the assembly plate 212 by means of two fixing elements 242, 244.

The supporting elements 290 are fixed in the Y and Z directions by two rails 232 and 234 in which zigzag-shaped grooves facing towards the supporting elements 290 are formed. The short transverse sides of the supporting elements 290 are inserted in these grooves and bonded or otherwise fixed. In this way the supporting elements 290 in the arrangement shown in FIGS. 8 and 9 are retained in an inclined position with respect to one another. As can be seen especially clearly in FIG. 9, this arrangement is distinguished by the fact that the supporting elements 290 are all arranged at the same angle to an optical axis OA. However, the orientation of the angles alternates, producing the zigzag configuration shown in FIG. 9. Each supporting element 290 is therefore aligned parallel to its next neighbor but one; with its immediate neighbor an acute angle of approximately 40° is formed.

Figure 10:
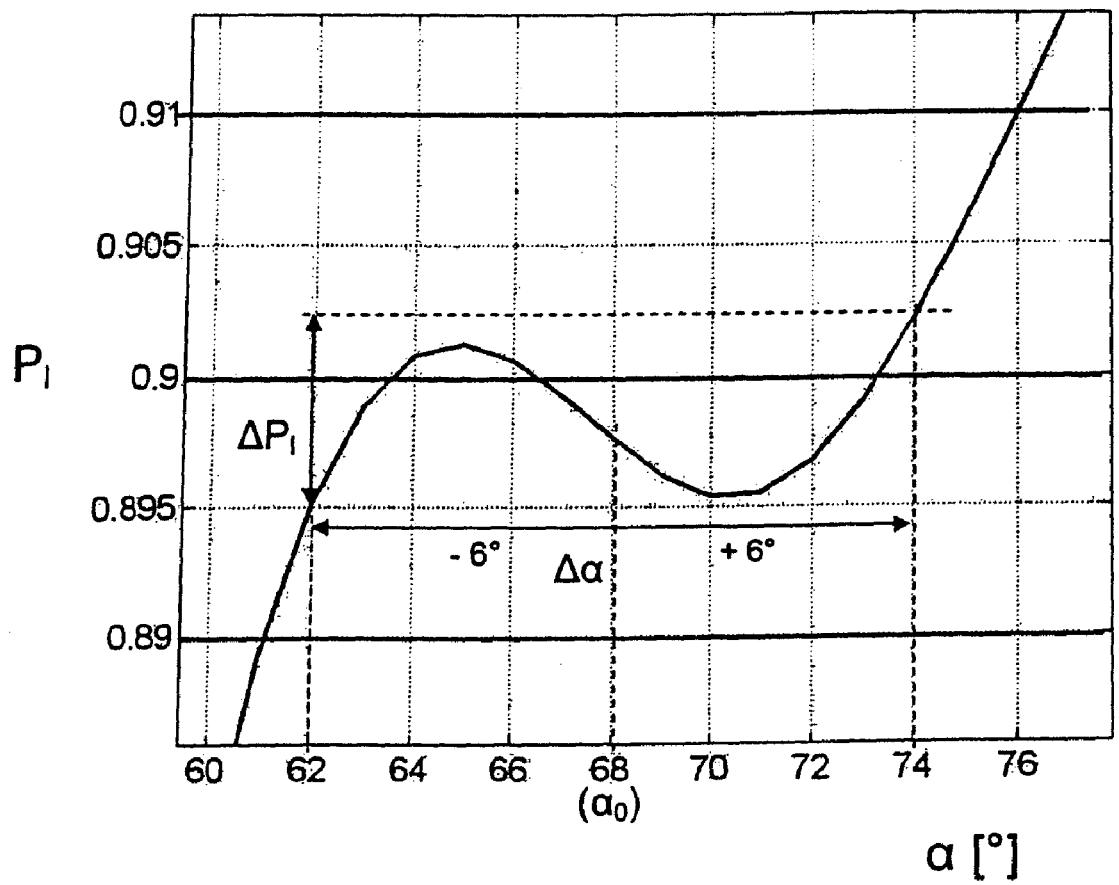
FIG. 10 shows a graph in which the angular dependence of the linear polarization degree of the polarization-selective beam splitting layer used is represented.

FIG. 10 shows a graph in which the degree of linear polarization $P_1$ as a function of the incidence angle α is plotted for the two beam splitting layers 292, 294 within an angular range between approximately 60° and 78°. The degree of linear polarization $P_l$ is defined as $$P_l = (T_t - T_s)/(T_t + T_s),$$

where $T_t$ and $T_s$ designate the degrees of transmittance for p-polarized light and s-polarized light respectively.

As can be seen in the graph of FIG. 10, the degree of linear polarization $P_l$, with values in the order of magnitude of approximately 90%, is very high when the light 64 impinges on the beam splitting layers 292, 294 at an incidence angle α which is of the order of magnitude of approximately 68°. The fluctuations $\Delta P_l$ of the linear polarization degree $P_1$ within an angular range Δα of approximately ±6° around this mean value of 68° are relatively small at approximately 0.75%.

This is important because the polarizer 210 shall ensure that light rays which do not impinge on the polarizer 210 parallel to the axis are also polarized to a high degree. Because an angular distribution in the pupil plane 8 of the masking objective 6 is converted into a positional distribution on the reticle R, fluctuations in the degree of linear polarization $P_l$ cause different areas of the reticle R to be illuminated with light polarized to different degrees.

In general, beam splitting layers have the characteristic that the highest possible average degree of linear polarization $P_l$ can only be achieved at the expense of angular dependence. For this reason the design of the beam splitting layers 292, 294 is generally a compromise between a high average degree of linear polarization $P_l$ on the one hand and its angular dependence on the other. In selecting the beam splitting layers 292, 294, account must also be taken of the angular distribution which is present in the pupil plane 8 in the individual case.

If, for example, the light field LF illuminated on the reticle R by means of the masking arrangement 5 is reduced in the X and Y directions, this leads to a corresponding reduction in the range of angles at which light rays can impinge on the beam splitting layers 292, 294. In such a case it can be advantageous to exchange the polarizer 210 for a similar polarizer in which the beam splitting layers have a higher mean degree of linear polarization $P_l$. In such a case, the greater angular dependence normally associated with such increased polarization can be tolerated because the angular range Δα has also become smaller.

Figure 11:
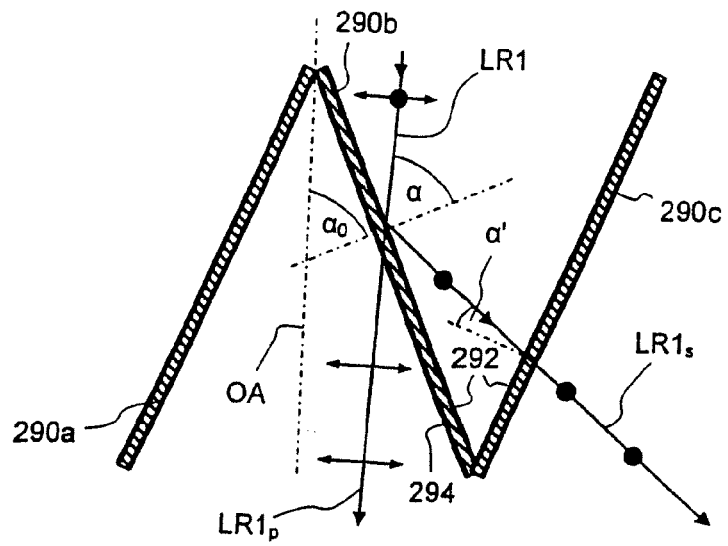
FIG. 11 shows an enlarged portion from the sectional representation of FIG. 9.

FIG. 11 shows an enlarged portion of the cross-section through the supporting elements 290 illustrated in FIG. 9. Each of the supporting elements 290 is arranged at an inclination to the optical axis OA such that the angle between the optical axis OA and the normals on the supporting elements 290 corresponds to the mean value $α_0 = 68°$ shown in FIG. 10. Light beams having angular distributions symmetrical to the optical axis OA are then polarized with similarly high degrees of polarization $P_l$ by the beam splitting layers 292, 294.

Marked in FIG. 11 is a light ray LR1 impinging at a small angle to the optical axis OA on the outwardly-facing polarization-selective beam splitting layer 292 of the supporting element 290b. This light ray LR1 forms an angle of 66° with the normal on the beam splitting layer 292. The light ray LR1 contains polarized components both perpendicular and parallel to the plane of incidence (paper plane). These components are again referred to here as the s- and p-polarized components and are indicated in FIG. 6 respectively by black disks and double arrows disposed perpendicularly to the ray LR1.

Because the incidence angle α=66° assumed here as an example is within the angular range Δα shown in FIG. 10, the s-polarized component is reflected by the beam splitting layer 292 and impinges, now designated as ray $LR1_s$, on the outwardly-facing beam splitting layer 292 of the neighbouring supporting element 290c.

The s-polarized ray $LR1_s$ can, however, penetrate both polarization-selective beam splitting layers 292, 294 on the supporting element 290c, since the incidence angle α' is now so small that the beam splitting layers 292, 294 are almost completely transmissive for s-polarized light also. However, because the light ray $LR1_s$, once it has been reflected, exits the polarizer 210 at a large angle to the optical axis OA, it is absorbed by surrounding housing parts and therefore does not contribute to illuminating the reticle R.

The p-polarized component of the light ray LR1, by contrast, is almost completely transmitted by both beam splitting layers 292, 294 of the supporting element 290b, so that almost completely p-polarized light exits from the rear face of the polarizer 210. In FIG. 11 the exiting light ray is designated $LR1_p$. Because of the low thickness of the supporting elements 290, which may be, for example, 0.5 mm, the refraction-determined offset of the transiting light ray $LR1_p$ is very small and is therefore not represented in FIG. 11.

Figure 12:
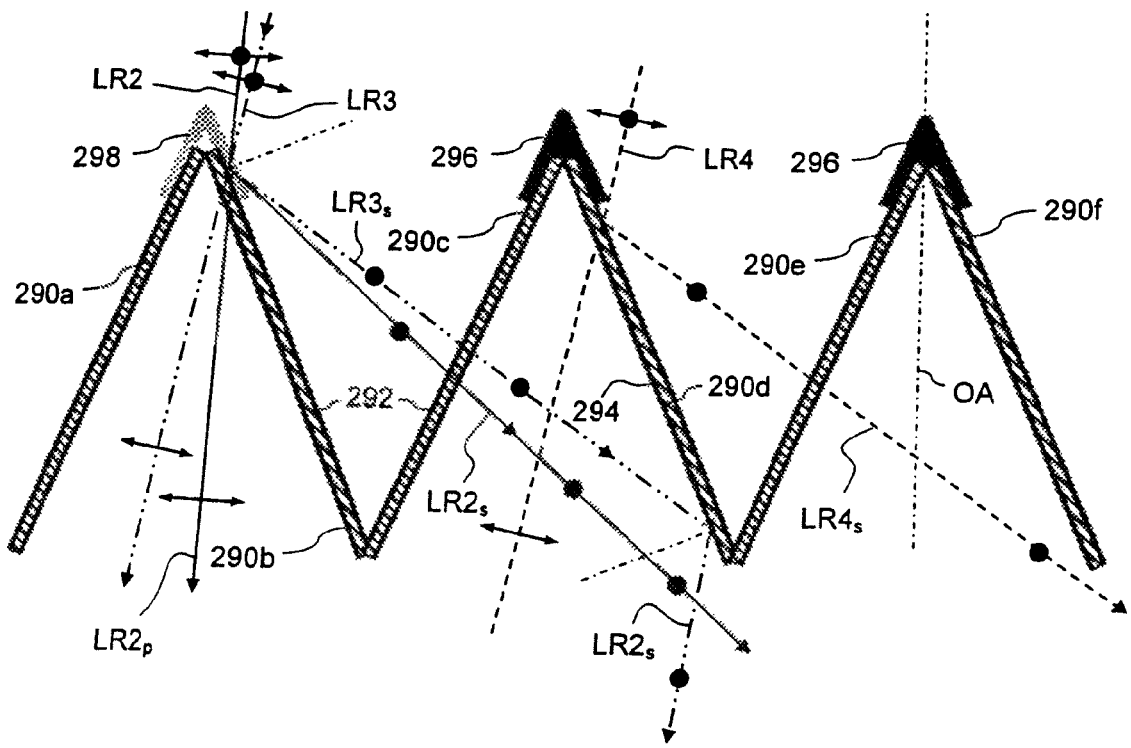
FIG. 12 is a representation corresponding to FIG. 11 of an advantageous configuration of the second embodiment, in which the zones along longitudinal edges of the supporting elements are covered with an absorbent layer.

FIG. 12 shows an arrangement similar to that in FIG. 11, but with a total of six supporting elements 290a to 290f. It is assumed here that a ray LR2 indicated by a continuous line impinges on the supporting element 290b similarly to the case in FIG. 11. Unlike the ray LR1 shown in FIG. 11, however, the point of impingement is located closer to the light source 1, i.e. in the vicinity of the pointed edge formed by the adjacent supporting elements 290a and 290b. As can be seen in FIG. 12, in this case, too, the s-polarized ray $LR2_s$ is reflected from the beam splitting layer 292 on the supporting element 290b in such a way that it passes through the adjacent supporting element 290c and is directed out of the beam path at a large angle to the optical axis OA.

The situation for a light ray LR3, which impinges on the polarization-selective beam splitting layer 292 on the upper face of the supporting element 290b at a larger angle to the optical axis OA, and therefore at a smaller angle of incidence, is somewhat different. The s-polarized reflected ray $LR3_s$ also passes through the supporting element 290c; however, this ray $LR3_s$ additionally impinges on the inwardly-facing beam splitting layer 294 of the supporting element 290d. This layer is reflective for s-polarized light, so that the ray $LR3_s$ is finally directed back into the beam path because of this reflection.

These twice-reflected light rays cause a reduction of the linear polarization degree $P_l$, unless appropriate countermeasures are taken.

In the variant shown in FIG. 12 this counter-measure consists in the fact that an absorbent layer 296 is applied to the end portions of the polarizer 210 on the entrance side, i.e. located away from the reticle R. In the arrangement of the supporting elements 290 shown in FIG. 12, these end portions are formed substantially by the longitudinal edges along which the supporting elements 290 abut one another. How far the end portions extend towards the reticle R depends on the geometry of the arrangement and on the possible incidence angles at which light can fall on to the beam splitting layers 292, 294.

The absorbent layer 296 has the effect that rays such as the light ray LR3 are first not reflected at all on striking the polarizer 210, so that these rays cannot be directed back into the beam path in an undesired manner. In FIG. 12 this type of blocking by an absorbent layer is indicated for the ray LR3 by a dotted area 298.

Indicated in addition by a broken line in FIG. 12 is a further light ray LR4, which impinges on the supporting element 290d at the same angle to the optical axis OA as light ray LR3 but does so slightly below the absorbent layer 296. The s-polarized component of this light ray LR4 is reflected at the beam splitting layer 292 in just such a manner that the reflected s-polarized ray LR4$_s$ cannot impinge a second time and with a larger incidence angle on a beam splitting layer and thereby be reflected back into the beam path.

Figure 13:
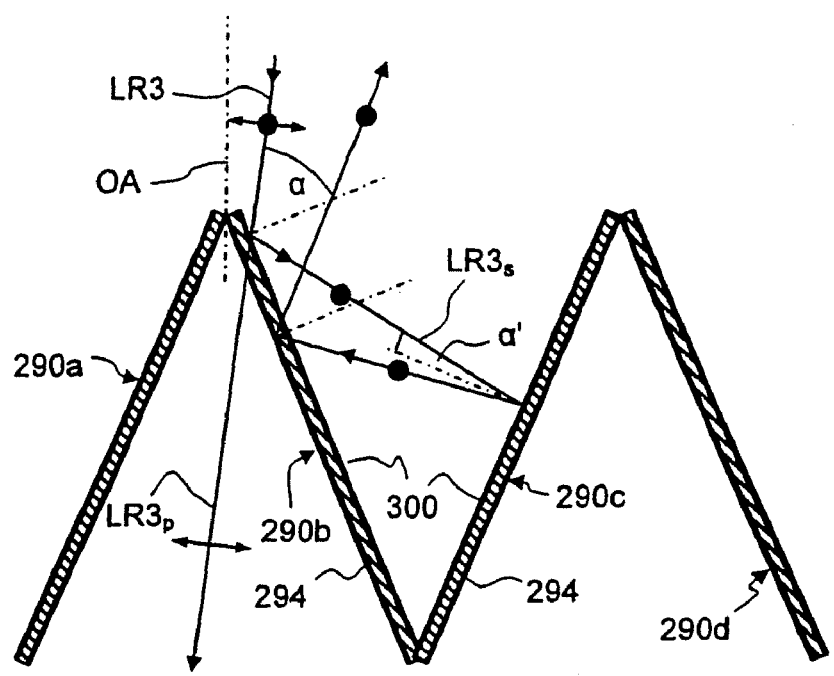
FIG. 13 is a representation corresponding to FIG. 11 of a further advantageous configuration of the second embodiment, in which an antireflection layer is applied to the supporting elements.

FIG. 13 shows another possible way of preventing s-polarized rays which have already been reflected once from re-entering the beam path through further reflection. For this purpose, each of the supporting elements 290a to 290d is provided with a polarization-selective beam splitting layer 294 on only one side, e.g. on the lower face oriented towards the reticle R. On the opposite upper face, by contrast, an antireflection layer 300 is applied to the supporting elements 290a to 290d. This antireflection layer 300 is designed in a manner known as such in such a way that it is reflective independently of polarization only for small incidence angles α. For this reason the ray LR3 incident for the first time on the antireflection layer 300 of the supporting element 290b is not reflected because the incidence angle α is too large. The ray LR3 therefore is split by the beam splitting layer 294 applied to the lower face, exactly as in the case shown in FIG. 12, into an s-polarized component and a p-polarized component, which respectively are reflected by and pass through the beam splitting layer 294 as the rays LR3$_s$ and LR3$_p$.

The reflected s-polarized component impinges as the ray LR3$_s$ on the antireflection layer 300 which is applied to the neighboring supporting element 290c. However, in this case the incidence angle α' is so small that the antireflection layer 300 reflects the ray LR3$_s$ completely, returning it to the antireflection layer 300 applied to the supporting element 290b. Although the angle of incidence on the antireflection layer 300 is again so large that the latter no longer has a reflecting effect, the s-polarized light of the ray LR3$_s$ is reflected by the beam splitting layer 294 located below the antireflection layer 300 and directed out of the beam path.

The solution represented in FIG. 13 has the advantage, as compared to the solution shown in FIG. 12, that no absorbent surfaces limit the light yield of the polarizer 210. However, because only one of the surfaces of the supporting elements 290 is provided with a polarization-selective beam splitting layer, the degree of linear polarization P$_l$ may be smaller in this case than in that of supporting elements covered on both sides with beam splitting layers.

Figure 14:
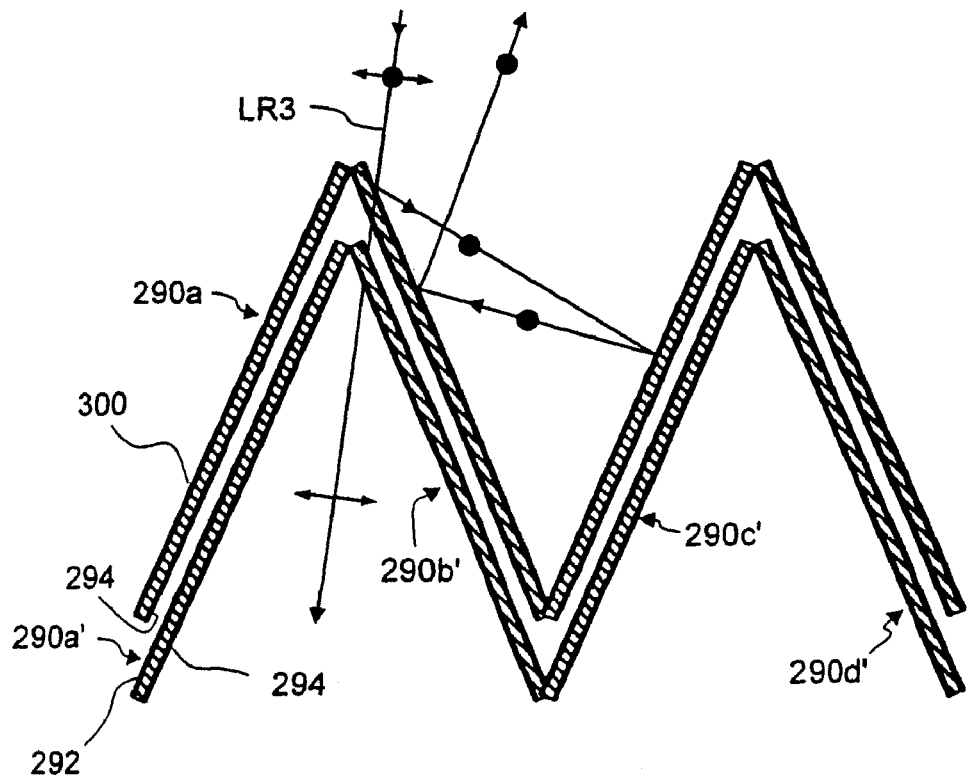
FIG. 14 is a representation corresponding to FIG. 13 in which supporting elements are arranged one behind the other in pairs along the optical axis.

To mitigate this deficiency also, a second arrangement of supporting elements 290a' to 290d' may be placed upstream or downstream of the supporting elements 290a to 290d, as is shown in FIG. 14. The supporting elements 290a' to 290d' carry a beam splitting layer on both sides, so that a total of three beam splitting layers contribute to polarization. Should a still higher degree of polarization be desired, more than two such arrangements may be arranged in a staggered formation one behind the other in the direction of the optical axis OA.

Figure 15:
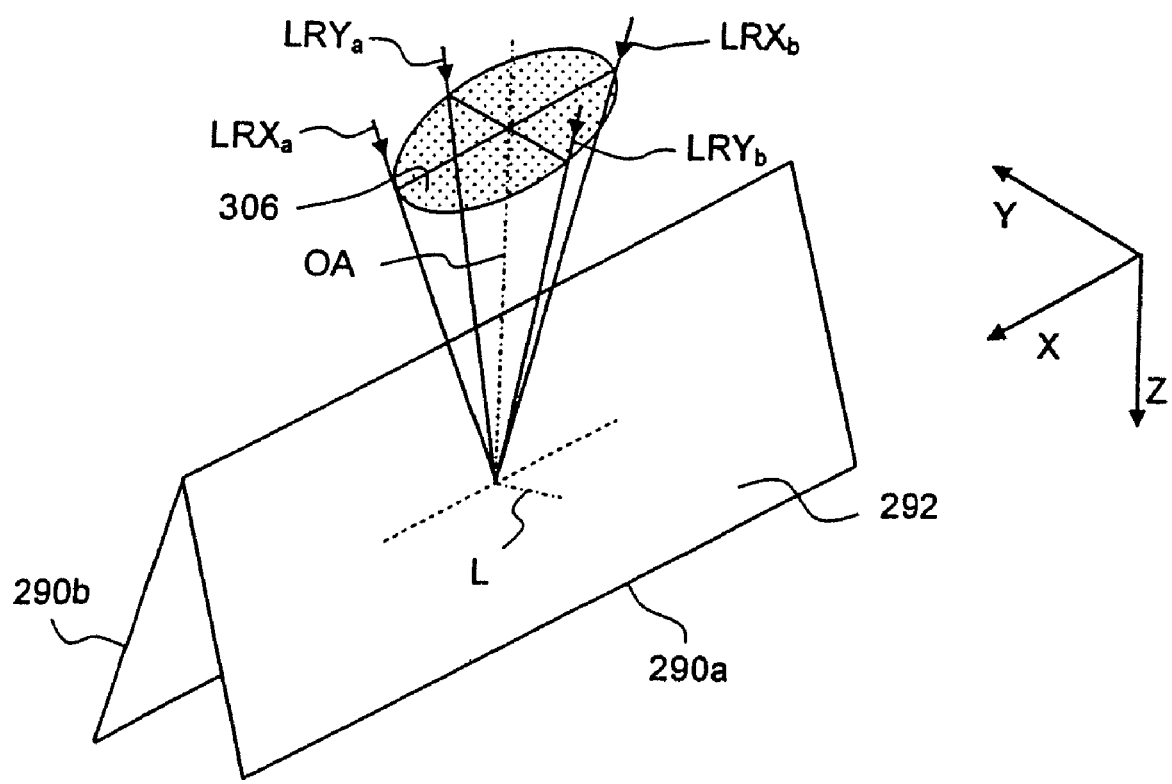
FIG. 15 shows in a schematic perspective representation two supporting elements on which a projection light beam impinges with asymmetrical angular distribution.

Illustrated in a perspective representation in FIG. 15 are two supporting elements 290a and 290b, light rays disposed at different angles to the optical axis OA of the illumination system IS being incident on the supporting element 290a. Rays disposed in each case at the largest possible angle to the optical axis OA in the X and Y directions are represented. As can be seen in FIG. 15, these angles are largest for rays which impinge on the beam splitting layer 292 in the XZ plane. The rays parallel to the XZ plane determine the dimensions of the light field LF in the X direction.

The dimensions of the light field LF in the Y direction perpendicular thereto are determined by the rays disposed in the YZ plane. These rays form smaller angles with the optical axis OA, as is indicated by the dotted ellipse 306 in FIG. 15.

If the normal L on the beam splitting layer 292 of the carrier 290a is located inside the YZ plane, this has the advantage that the range Δα of the possible incidence angles is relatively small. This is of importance in that the two rays LRY$_a$ and LRY$_b$ incident in the YZ plane do not impinge on the beam splitting layer 292 at the same incidence angle. This is not the case for the rays LRX$_a$ and LRX$_b$ incident in the XZ plane, i.e. both rays impinge on the beam splitting layer 292 with the same incidence angle.

Because the degree of linear polarization P$_l$ depends on the incidence angle α, this has the result that the light field IL is illuminated in a manner such that the degree of polarization varies three-dimensionally—if only slightly—along the Y direction. However, in the arrangement shown in FIG. 15 these variations are slight, since the rays incident in the YZ plane cover a smaller angular range than the rays incident in the XZ plane. However, with the arrangement of the two supporting elements 290a, 290b rotated through 90° with reference to the optical axis OA, the three-dimensional inhomogeneities in the X direction, i.e. along the long side of the illuminated field IL on the reticle R, would be considerably greater.

For this reason it is advantageous if the beam splitting layers 290 are, as far as this is possible, oriented such that the normal L is disposed in the plane extending through the optical axis and the direction in which the angles of the rays in relation to the optical axis OA are smallest. In projection exposure apparatuses designed for scanning operation, this direction is the scanning direction. The preceding considerations apply, of course, quite generally to polarization-selective beam splitting layers, and therefore are not restricted to the second embodiment shown in FIGS. 8 to 15.

Third Embodiment

A third embodiment of a polarizer which is also suited to being introduced into the pupil plane 8 of the masking objective 6, as shown by way of example in FIG. 2, is explained below. Parts which are also present identically or correspondingly in the polarizer 10 are designated by reference numerals increased by 400.

Figure 16:
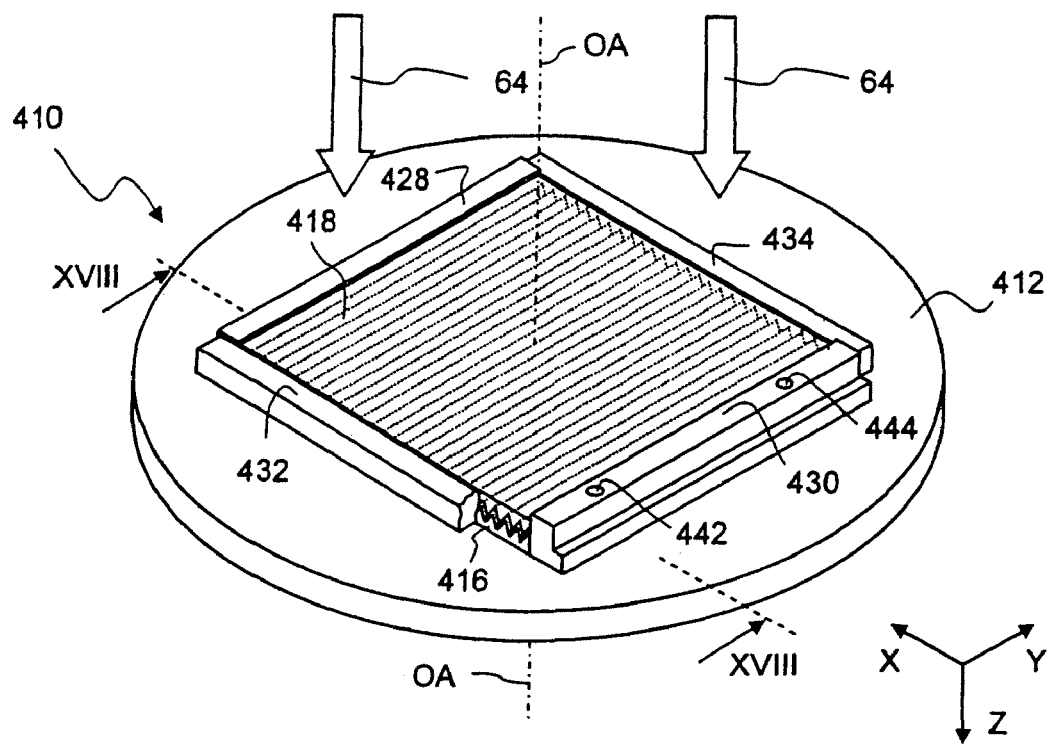
FIG. 16 is a perspective view of a polarizer according to a third embodiment of the invention, which is also suitable for the illumination system shown in FIG. 2.
Figure 17:
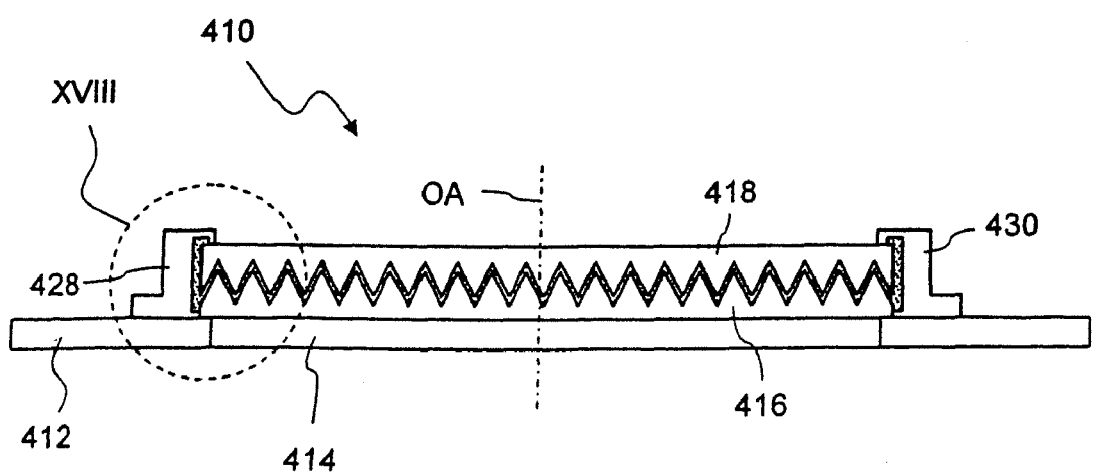
FIG. 17 is an enlarged sectional representation of the polarizer shown in FIG. 16 along the line XVII-XVII.

FIGS. 16 and 17 show a polarizer 410 according to the third embodiment in a perspective view and in a horizontal section along the line XVII-XVII respectively. The polarizer 410 also has a circular assembly plate 412 which is provided with a central rectangular opening 414 and which can be introduced into the beam path of the illumination system IS, e.g. by insertion into a filter holder 11, as shown in FIG. 2. A first plate 416 and a second plate 418, which are arranged one behind the other along the optical axis OA, extend across the opening 414.

The arrangement of the two plates 416, 418 is limited in the X direction by two stops 428, 430. The stop 430 is fixed detachably to the assembly plate 412 by means of two fixing elements 442, 444. The two plates 416, 418 are fixed in the Y and Z directions by two rails 432 and 434.

The construction of the plates 416, 418 is elucidated below with reference to the detailed representation shown in FIG. 18.

Figure 18:
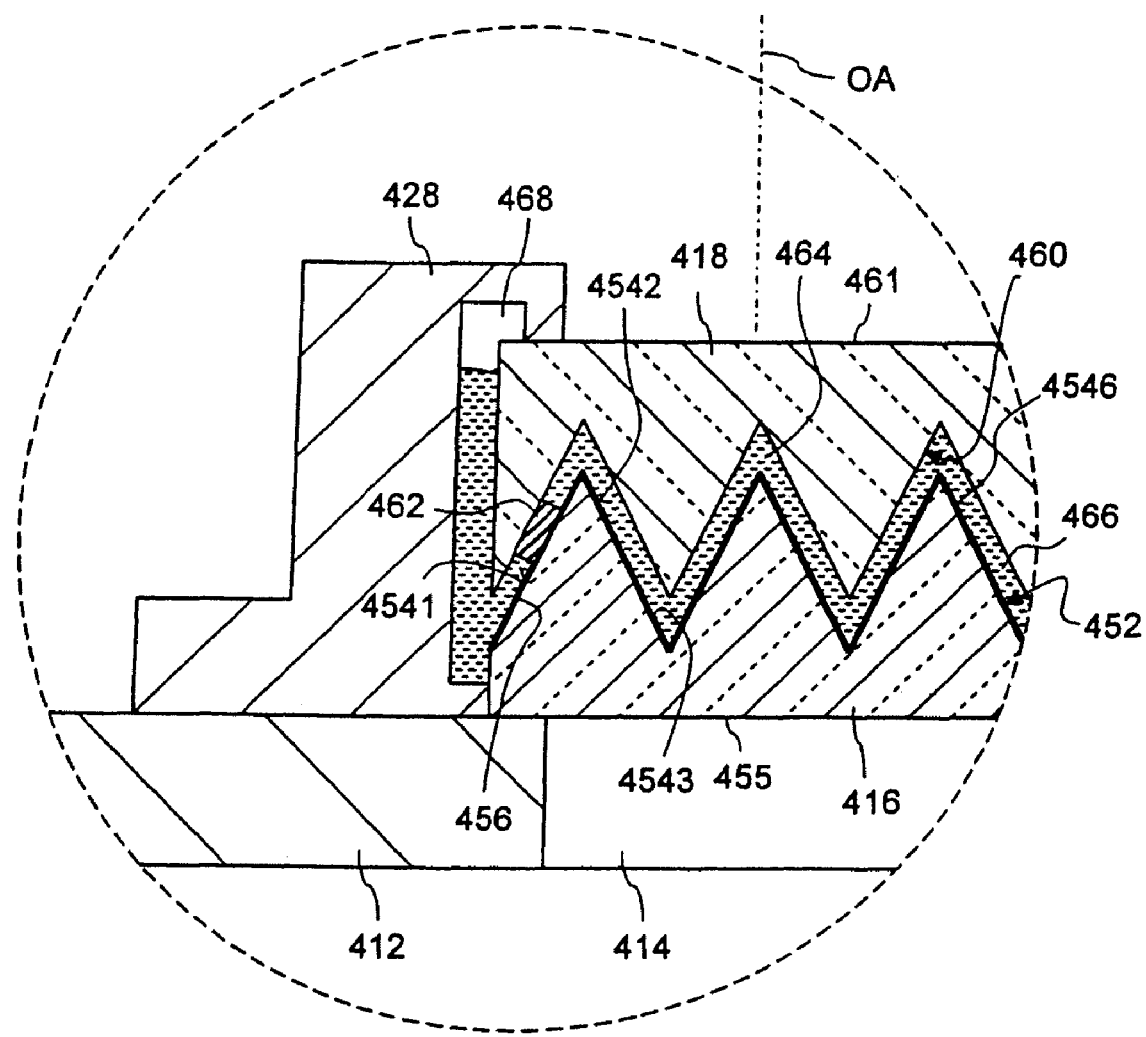
FIG. 18 shows an enlarged portion of the sectional representation of FIG. 17.

FIG. 18 shows a portion of the sectional representation in FIG. 17 in which the edge portion of the plates 416, 418 close to the stop 428 can be seen with further details. The upper face of the plate 416 is formed by a first face 452 which is subdivided into a plurality of partial faces 454₁, 454₂, ..., 454$n$, which are rectangular in the embodiment shown. The partial faces 454₁, 454₂, ..., 454$n$ are each inclined at a angles to the optical axis OA that have equal absolute values and carry a polarization-selective beam splitting layer denoted as a whole by 456. Through the alternating inclination of the partial faces 454₁, 454₂, ..., 454$n$, the first face 452 is given a zigzag-shaped cross-section. For defining the angle of inclination of the partial faces similar principles may be applied to those explained earlier with reference to the second embodiment described in FIGS. 8 to 15.

The first plate 416 has in addition a flat second face 455 which, when the first plate 416 is installed, is disposed perpendicularly to the optical axis OA and forms the underside of the first plate 416.

The second plate 418 is configured substantially in exactly the same way as the first plate 416. Located directly opposite the first face 452 of the first plate 416 is a first face 460 which is likewise subdivided into partial faces not individually designated. The partial faces are arranged at the same angle to the optical axis OA as the partial faces 454₁, 454₂, ..., 454$n$ of the first plate 416. In this way the faces 452, 460 of the first plate 416 and the second plate 418 respectively, which face towards one another, are congruent, so that if the plates 416, 418 were joined to one another a cavity-free body would be produced.

In the embodiment represented in FIGS. 16 to 18 the first face 460 of the second plate 418 is not provided with a beam splitting layer. Such a layer may, however, be applied to the second face 460 if required, for example, in order to increase the degree of polarization.

A face of the second plate 418 facing away from the first plate 416 is flat and is designated by 461.

A plurality of spacers 462, e.g. three or four, are placed on the first face 452 of the first plate 416 and joined to the first plate 416, for example, by bonding. The spacers 462 should be arranged outside the area of the polarizer 410 through which light passes. The spacers 462, which may be, for example, small cuboids of special steel or ceramic material, ensure that a gap 464 of uniform thickness is maintained between the opposed faces 452, 460 of the two plates 416, 418 respectively.

In the embodiment illustrated the gap 464 is completely filled with a liquid 466. The liquid 466 used should be so selected that the relation to the refractive indices of the materials from which the two plates 416, 418 are manufactured is as close as possible to 1:1 at the wavelength of the projection light. The better the refractive indices agree, the smaller is the light refraction at the inclined partial faces delimiting the gap 464. If, for example, the two plates 416, 418 are made of quartz glass ($SiO_2$, n=1.56), magnesium fluoride ($MgF_2$, n=1.43) or calcium fluoride ($CaF_2$, n=1.50), the difference of refractive indices Δn is between 0.01 and 0.12, when water ($H_2O$) is used as the liquid 466. This value is so small that light rays are only slightly offset laterally when passing through the gap 464, without their direction being changed.

To ensure that the gap 464 always remains completely filled with liquid 466, a reservoir 468 for liquid 466 is provided in at least one of the stops 428, 430, 432, 434. The reservoir 468 may be in fluid communication with the gap 464. A sufficiently high liquid level in the reservoir 468, as shown in FIG. 18, ensures that the gap 464 is always completely filled with liquid 466.

If polarized light falls on the first face 458 of the second plate 418 in the direction of the arrows 64, as shown in FIG. 16, the arrangement of the two plates 416, 418 acts as a whole like a plane-parallel plate if the liquid 466 has at least approximately the same refractive index as the surrounding optical media. After passing through the liquid 466, the projection light impinges on the beam splitting layer 456 arranged at an inclination to the optical axis OA and is linearly polarized. The p-polarized component of the projection light passes through the beam splitting layer 456 while the s-polarized component is reflected. To pre-vent unwanted back-scattering of the s-polarized light already reflected once, possible solutions explained earlier with reference to the second embodiment (cf. in particular FIGS. 12 and 13) may be adopted.

Figure 19:
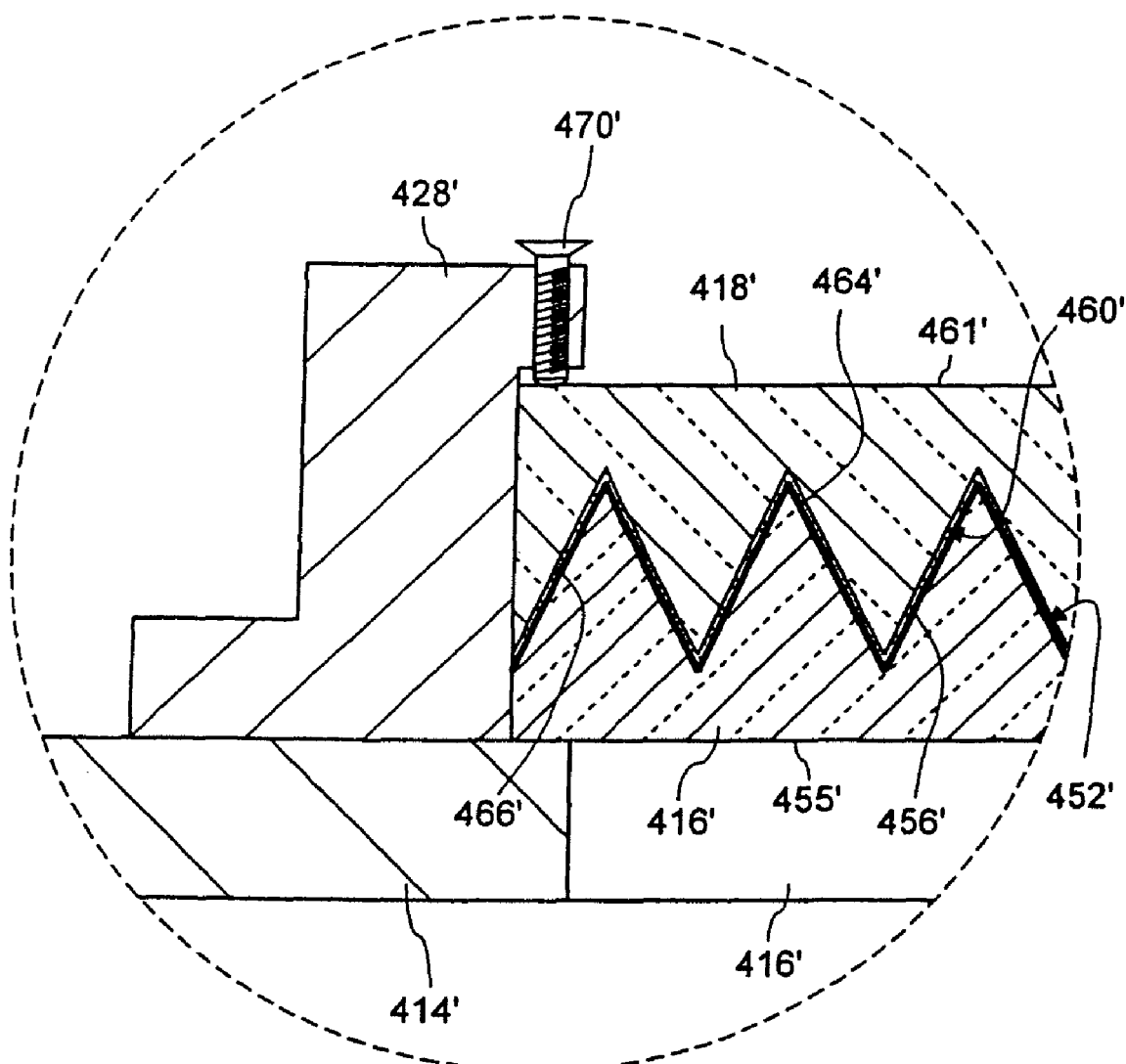
FIG. 19 shows a section corresponding to FIG. 18 of a variant having a narrower a gap between the plates.

FIG. 19 shows a variant of the third embodiment represented in FIGS. 17 to 19 in a detailed representation analogous to FIG. 18. In this variant the gap designated 464' between the two plates 416', 418' is only a fraction of a millimeter wide, e.g. 10 μm. Under these circumstances the liquid 466' in the gap 464' forms a thin film in which adhesion forces between the liquid 466' and the faces 452', 460' delimiting the gap 464' become noticeable. These adhesion forces prevent the liquid 466' from escaping from the gap 464'. In this way a reservoir 468, as can be seen in FIG. 18, may optionally be dispensed with.

To keep the liquid film thin enough and to set the desired distance between the plates 416', 418', the two plates 416', 418' may be loaded towards one another by means of a pressing device. In the simplest case such a pressing device is an adjusting screw 470' having a shank that acts on the flat upper face 461' of the second plate 418'.

In the variant shown in FIG. 19, too, it is ensured that the light rays passing through the polarizer are not subjected to any significant refraction. Furthermore, the manufacture of the polarizer according to this variant is particularly simple, provided no reservoir is required.

Figure 20:
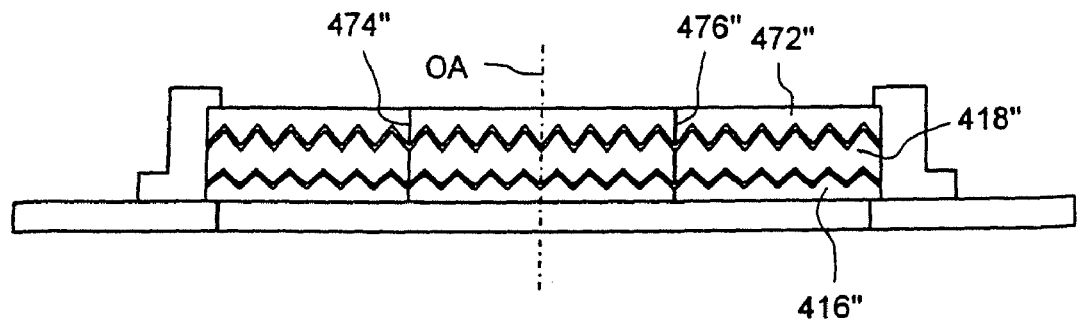
FIG. 20 is a sectional representation corresponding to FIG. 17 according to a further variant having a total of three plates.
Figure 21:
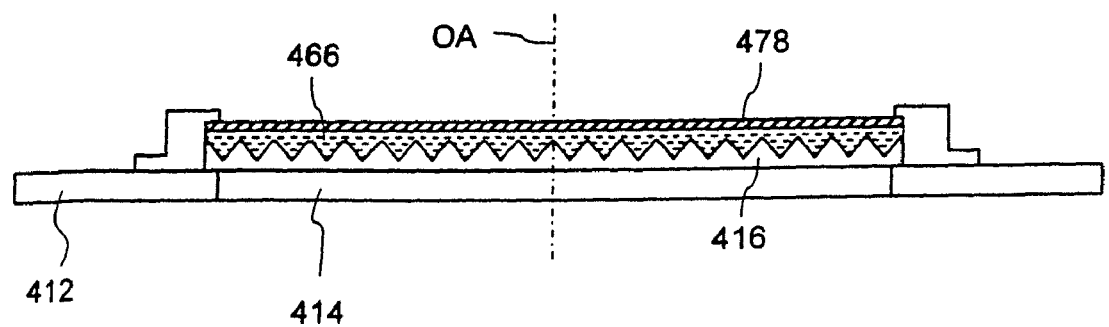
FIG. 21 is a sectional representation corresponding to FIG. 17 according to yet another variant in which one plate is plane-parallel.

FIG. 20 shows a further variant of the third embodiment in which the polarizer 410 includes a total of three plates 416", 418" and 472" arranged one above the other. Each of the three plates 416", 418" and 472" is subdivided into a plurality of individual segments, as is indicated in FIG. 21 by segment boundaries 474", 476". The subdivision of the plates 416", 418" and 472" into a plurality of individual segments simplifies the manufacture of the polarizer. The number of segment boundaries 474", 476" should, however, be kept small in order to reduce possible centers where scattering may occur.

In the variant shown in FIG. 20 the projection light passes through a total of four partial faces inclined with respect to the optical axis OA. If each of these faces is provided with a beam splitting layer, a very high degree of polarization close to 100% can be attained in this way. The plates 416", 418" and 472" may either be separated by a gap filled with water, as in the variants described previously, or may be joined together directly by optical contacting.

FIG. 21 shows yet another variant of the polarizer 410. This variant differs from the variant described in FIGS. 16 to 18 only in that the second plate 418 is replaced by a plane-parallel transparent plate 478. With the variant shown in FIG. 21 it is particularly important that the refractive index of the liquid 466 should differ as little as possible from the refractive index of the optical media of which the first plate 416 and the plane-parallel plate 474 are made. Only then is it ensured that the polarizer 410 of this fourth variant acts like a plane-parallel plate with respect to light refraction.

Fourth Embodiment

Figure 22:
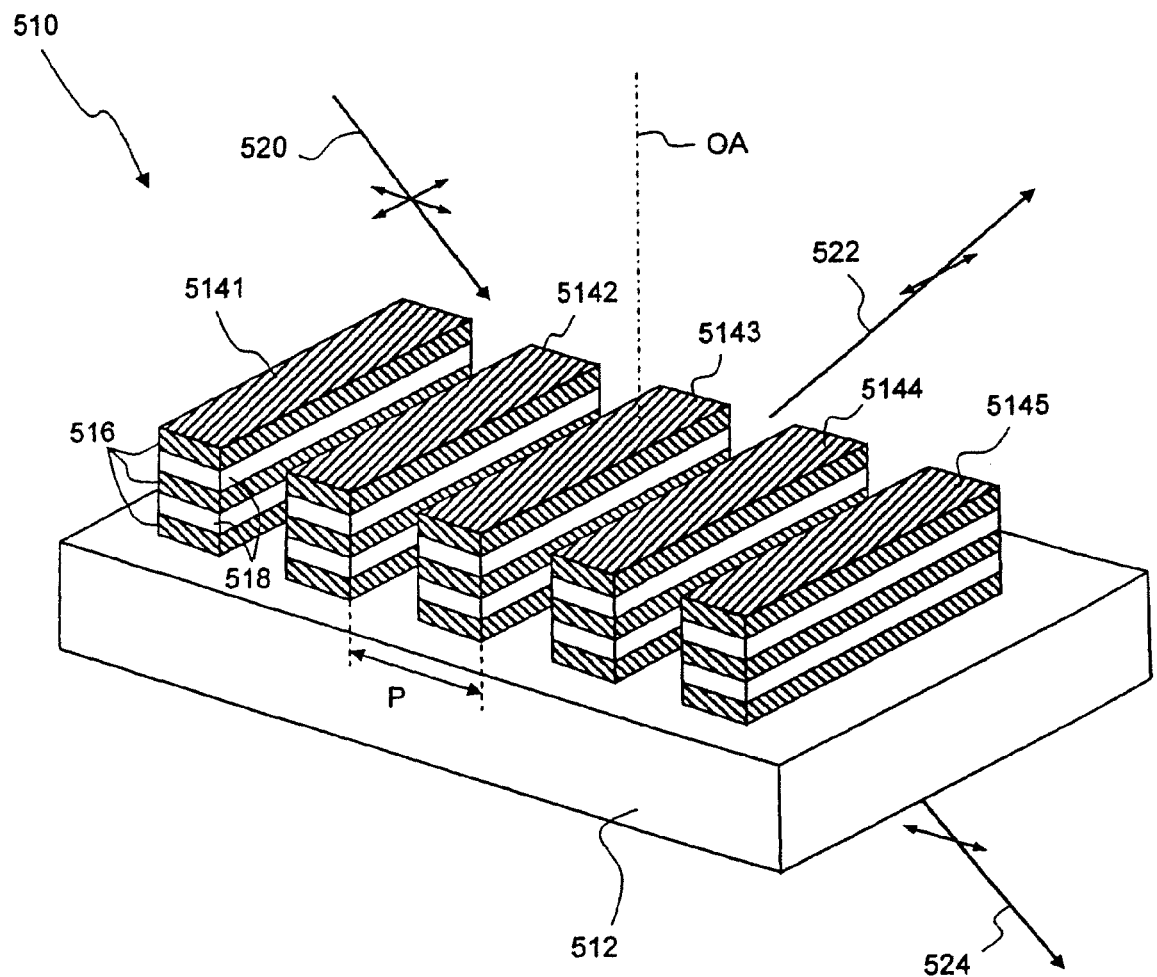
FIG. 22 is a perspective view of a polarizer according to a fourth embodiment of the invention, which is also suitable for the illumination system shown in FIG. 2.

FIG. 22 shows a greatly enlarged perspective representation of a section from a polarizer 510 which is also suited to being introduced into the pupil plane 8 of the masking objective 6 as is shown, for example, in FIG. 2.

The polarizer 510 includes a substrate 512 which may consist, for example, of quartz glass ($SiO_2$). A plurality of periodically spaced grating structures are applied to the substrate 512; only five such structures 5141 to 5145 can be seen in the section in FIG. 22. The grating period P by which the individual grating structures 5141 to 5145 are spaced is of the order of magnitude of the wavelength of the projection light.

The individual grating structures 5141 to 5145 have a laminated structure in each case. In the embodiment shown in FIG. 22, layers 516 of silicon alternate with layers 518 of quartz glass.

The operation of the polarizer 510 is based on form birefringence of periodic grating structures. The angular dependence of the polarization selectivity can be reduced by resonant effects. Further details regarding such gratings can be found in the essay already mentioned, by Tyan et al. entitled "Design, fabrication, and characterization of form-birefringent multilayer polarizing beam splitter", J. Opt. Soc. Am A, Vol. 14, No. 7, 1997, pages 1627 to 1636. The full disclosure of this essay is incorporated herein by reference.

If unpolarized or circularly polarized light impinges on the polarizer 510, as is indicated in FIG. 22 by an arrow 520, the polarization component oriented in the longitudinal direction of the grating structures 5141 to 5145 is almost completely reflected by the polarizer 510 (ray 522). The polarization component perpendicular thereto, in which the polarization direction is oriented in the transverse direction of the grating structures 5141 to 5145, however, is almost completely transmitted (see ray 524). The polarizer 510 has, among others, the advantage that it has a very small extension in the direction of the optical axis OA. Further, it allows to attain very high degrees of polarization over a larger angular range.

The grating structures 5141 to 5145 may also be curved. If curved grating structures 5141 to 5145 are arranged parallel to one another, the grating period P remains constant, so that only the direction of polarization but not the degree of polarization changes as a function of position. With such curved grating structures 5141 to 5145 it is very simple to realize a polarizer that linearly polarizes light in a direction that varies over the area of the polarizer. If, for example, the grating structures are disposed tangentially to the optical axis, transiting light is polarized radially. By means of a half-wave plate the polarization direction can a rotated through 90°, producing a tangential distribution of polarization. Alternatively, it can be achieved by a different design of the grating parameters that the polarization component oriented in the longitudinal direction of the grating structures 5141 to 5145 is not reflected but transmitted. Conversely, the polarization component perpendicular thereto is then reflected. Tangentially disposed grating structures then polarize transiting light tangentially without the need for a half-wave plate.

Polarizer Arrangements

Different arrangements of polarizers are described below. The polarizers are in each case either polarizers 10, as shown in FIGS. 3 to 8, polarizers 210, as shown in FIGS. 9 to 14, or one of the variants of the polarizers 410 and 510, as shown in FIGS. 16 to 22. For the arrangements themselves it is unimportant which type of polarizer is involved. However, for simplicity the following embodiments will be explained with reference to particular polarizers mentioned above, although this should not be understood restrictively. Moreover, in addition to the polarizers described in detail here, certain known polarizers may be used as well.

Figure 23:
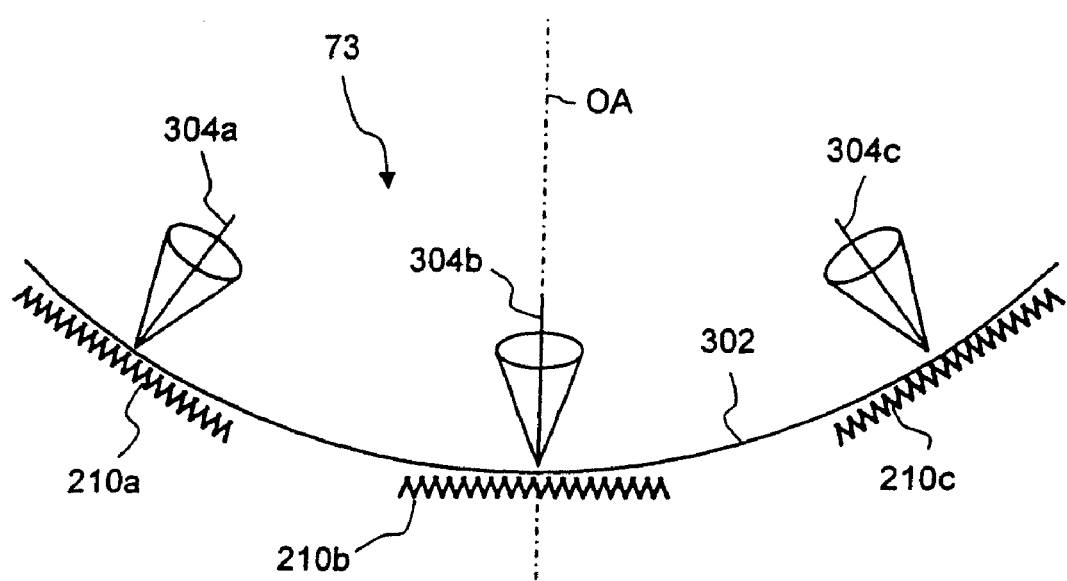
FIG. 23 is a greatly simplified sectional view through a polarizer arrangement comprising a plurality of polarizers which are arranged along a curved pupil surface.

FIG. 23 shows in a schematic sectional representation a first polarizer arrangement 73 comprising a plurality of relatively small polarizers 210a, 210b and 210c which in each case are configured as shown in FIGS. 8 to 14. In the polarizer arrangement 73 the supporting elements 290 of the polarizers 210a, 210b, 210c are not all arranged commonly in a plane perpendicular to the optical axis OA. Instead, the planes in which the supporting elements 290 of each polarizer 210a, 210b, 210c are arranged are disposed tangentially to a pupil surface 302 which is curved towards its edges. In FIG. 23 the curvature of the pupil surface 302 is represented in strongly exaggerated form; in reality the angular deviation between the mean incidence directions 304a and 304c with respect to the optical axis is of only a few degrees, typically approximately 1° to 4°.

Through the tangential arrangement of the planes within which the supporting elements 290 of the polarizers 210a, 210b, 210c are disposed, it is ensured that the supporting elements are arranged at least approximately at the optimum angle with respect to the incidence directions 304a, 304b and 304c. In the configuration shown in FIG. 23 this applies, of course, only approximately, since the polarizers 210a, 210b, 210c are only disposed tangentially to the curved pupil surface 302 and are not themselves curved. The smaller the areas in the pupil surface through which light actually passes, the better, generally, is the tangential approximation.

If the pupil is to be completely transited by light and the curvature of the pupil surface 302 is not negligible, the polarizer 210 shown in FIG. 8 may be bended. The polarizer 210, when installed in the illumination system IS, is then bent in such a way that the reference plane of the supporting elements 290 is adapted to the curvature of the pupil surface 302. The polarizer 210 may also, of course, be manufactured with appropriate curvature at the outset. In both cases the angles at which the supporting elements 290 are arranged with respect to the optical axis OA in this configuration vary quasi-continuously across the pupil surface 203.

Figure 24:
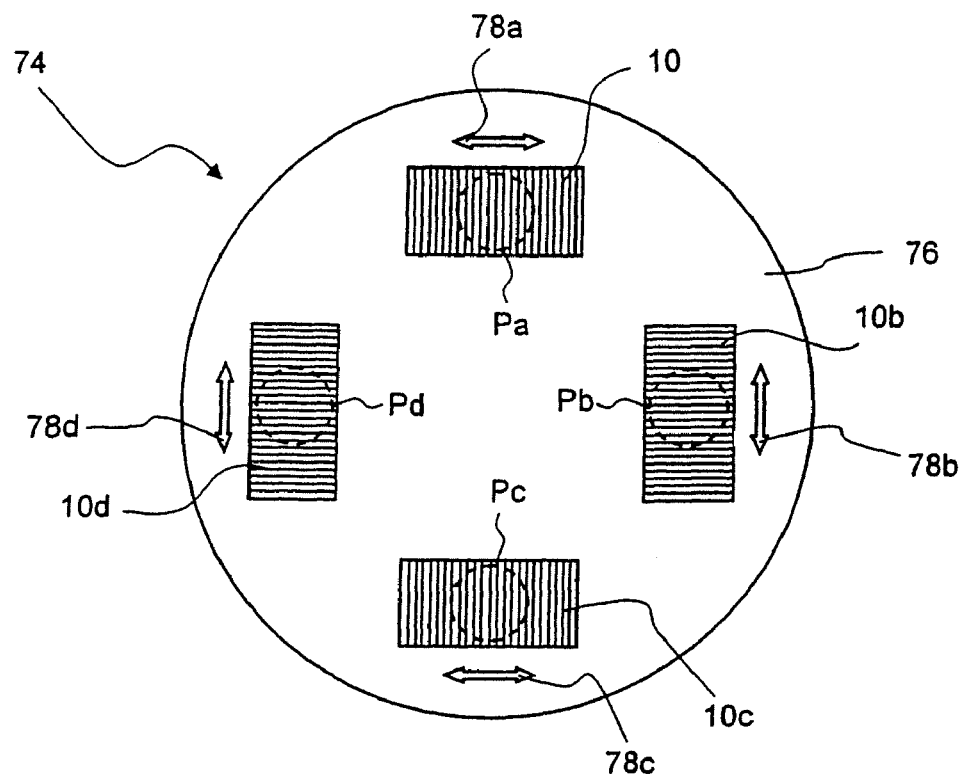
FIG. 24 shows a polarizer arrangement comprising a total of four polarizers for quadrupole illumination.

FIG. 24 shows in a top view a second polarizer arrangement 74 comprising a total of four polarizers 10a, 10b, 10c and 10d which are accommodated together, in a manner not represented in detail, in a carrier 76 and may each be constructed, for example, as illustrated in FIGS. 3 to 7. The polarizer arrangement 74 is provided to be inserted in the filter holder 11 of the illumination system IS in the case of what is referred to as a quadrupole illumination setting. With such a quadrupole illumination setting, the illumination of a pupil plane is restricted to four separate zones which are also referred to as poles. The poles are distributed along the edge of the pupil in such a way that their arrangement has a fourfold symmetry. In FIG. 24 the poles are indicated by broken circles Pa, Pb, Pc and Pd.

In a correct angular orientation of the carrier 76, the individual polarizers 10a, 10b, 10c and 10d, whose polarization directions are indicated by arrows 78a, 78b, 78c and 78d, are located in the region of the poles. In this case respective opposite polarizers 10a, 10c and 10b, 10d form pairs having the same polarization direction; the polarization directions of the two pairs are disposed perpendicularly to one another.

With such quasi-tangential polarization an increase in contrast can be achieved, particularly when projecting reticles containing structures that are extremely fine and are disposed orthogonally to one another. The carrier 76 and the components of the illumination system generating the quadrupole illumination should be angularly oriented in such a way that the polarization directions 78a to 78d of the polarizers 10a to 10d coincide with the orthogonal pre-dominant directions of the structures to be imaged.

Figure 25:
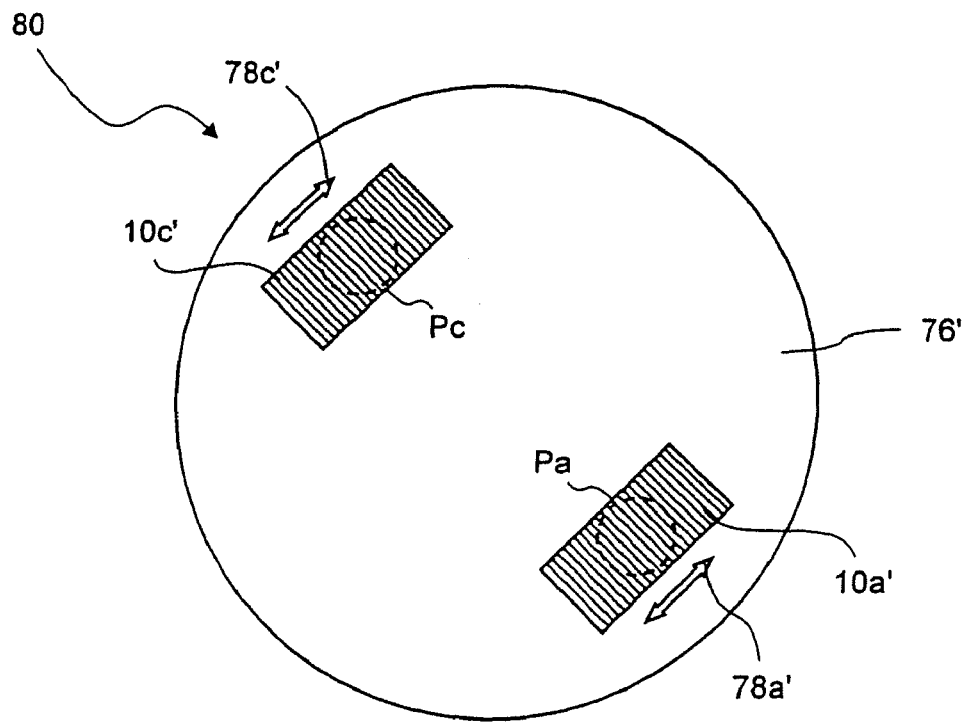
FIG. 25 shows a polarizer arrangement comprising a total of two polarizers for dipole illumination.

FIG. 25 shows in a top view a third polarizer arrangement 80 which is provided with two poles Pa, Pc for dipole illumination. Unlike the polarizer arrangement 74 shown in FIG. 7, in this case only one pair of polarizers 10a', 10c' having the same polarization direction 78a', 78c' is arranged on a carrier 76'. The polarizer arrangement 80, to be used with dipole illumination, permits still smaller structures to be imaged with high contrast, provided they are disposed in the polarization direction 78a', 78c' of the polarizers 10a', 10c'. However, no increase in contrast is achieved for structures disposed orthogonally thereto.

Figure 26:
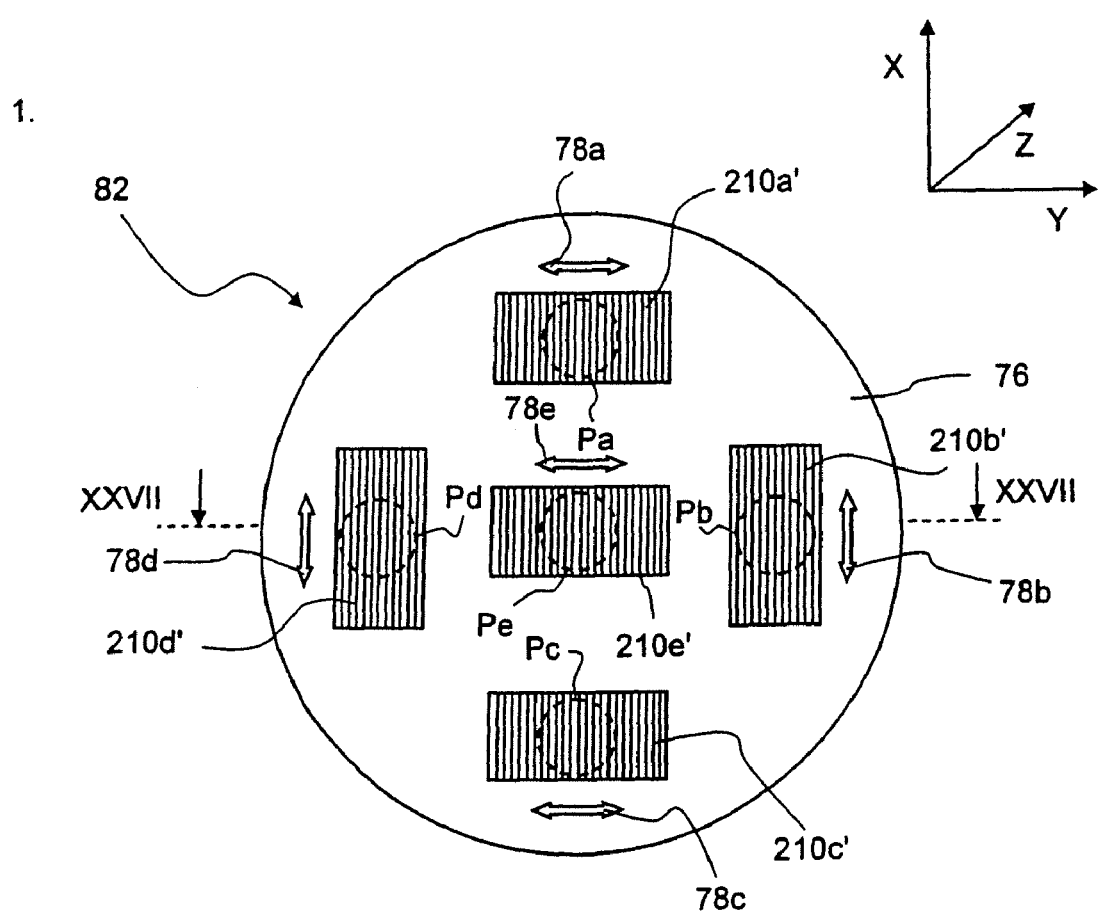
FIG. 26 shows a polarizing arrangement for so-called C-quad illumination.
Figure 27:
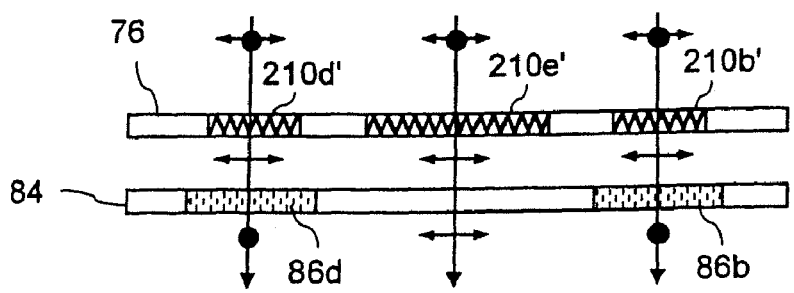
FIG. 27 shows a section through the arrangement shown in FIG. 26 along the line XXVII-XXVII.

FIGS. 26 and 27 show, in a top view and in a section along the line XXVII-XXVII respectively, a fourth polarizer arrangement 82 which includes a total of five polarizers 210a', 210b', 210c', 210d' and 210e'. Each of the polarizers 210a' to 210e' includes a thin plate-like carrier for beam splitting layers, as shown in FIGS. 11 to 15. Each of the polarizers 210a' to 210e' covers a pole of a so-called C-quad illumination, which differs from the quadrupole illumination shown in FIG. 24 by an additional pole Pe at the center of the pupil.

The special feature of the polarizer arrangement 82 shown in FIGS. 26 and 27 is that the supporting elements 290 of all the polarizers 210a' to 210e' have the favorable alignment shown in FIG. 15. The normals L on the supporting elements 290 are therefore all located in the YZ plane which is disposed perpendicularly to the paper plane. The elongated supporting elements 290 are thus all aligned parallel to the X direction. As a result, the light passing through the polarizers 210a' to 210e' is polarized very uniformly and with a high degree of linearity, the oscillation planes of the electrical field vectors all being located in the XY plane.

However, with C-quad illumination it is desired that the polarization directions at the individual poles Pa to Pe are as indicated by the arrows 78a to 78e. The light passing through the polarizers 210b and 210d is therefore not polarized in the desired manner.

In order to obtain the desired polarization direction for the poles Pb and Pd also, the polarizer arrangement 82 includes a further carrier 84 which is arranged parallel to the carrier 76 and can therefore only be seen in the sectional representation of FIG. 27. In the further carrier 84, circular half-wave plates 86b, 86d are inserted in suitable recesses below the poles Pb and Pd. The half-wave plates 86b, 86d rotate the polarization direction of transiting linearly polarized light through 90°, whereby the desired polarization direction indicated by the arrows 78b, 78d is obtained.

The polarizer arrangement illustrated in FIGS. 26 and 27 has the advantage that the angular dependence of the linear polarization degree $P_l$ is the same for all the poles Pa to Pe. In the polarizer arrangement 74 shown in FIG. 24, by contrast, this angular dependence is different for poles Pa and Pc than for poles Pb and Pd as a result of the effect explained with reference to FIG. 15.

Figure 28:
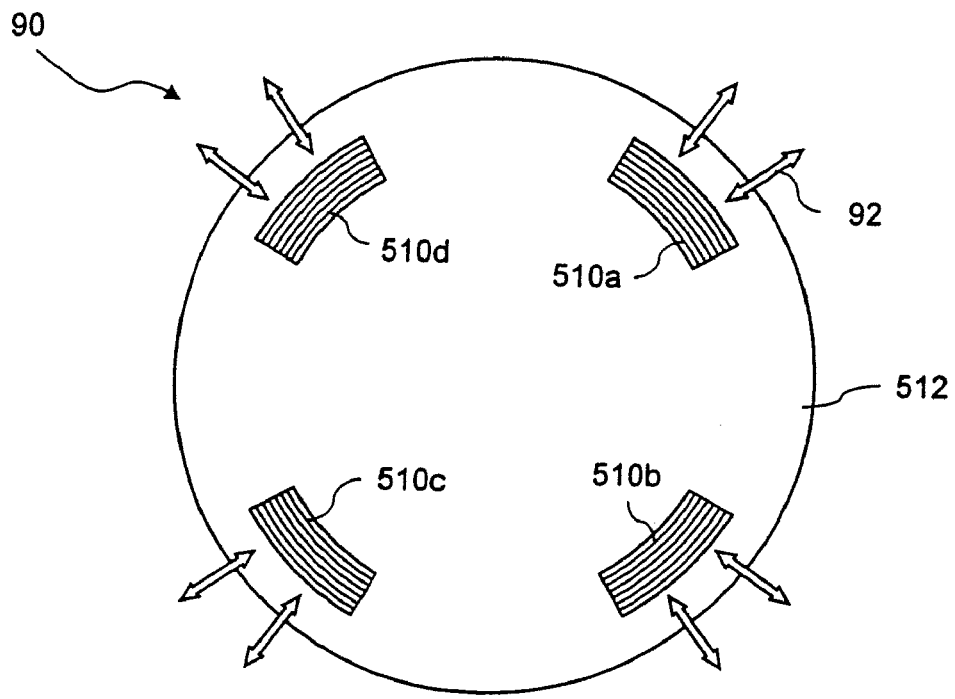
FIG. 28 shows a polarizer arrangement comprising a total of four polarizers for quasar illumination.

FIG. 28 shows in a top view a fifth polarizer arrangement 90 which includes a total of four polarizers 510a, 510b, 510c and 510d. Each of the polarizers 510a to 510d contains grating structures applied to a common transparent substrate 512, as was explained with reference to FIG. 22. The grating structures of the individual polarizers 510a to 510d are in each case curved and are disposed parallel to one another on the substrate 512.

Each of the polarizers 510a to 510d covers a pole (not shown in FIG. 28) of a so-called quasar illumination which is produced from the quadrupole illumination shown in FIG. 24 by a rotation through 45° about the optical axis. Because the grating structures are disposed tangentially, the transiting light is polarized perpendicularly thereto, i.e. radially. This is indicated by arrows 92 in FIG. 28.

Figure 29:
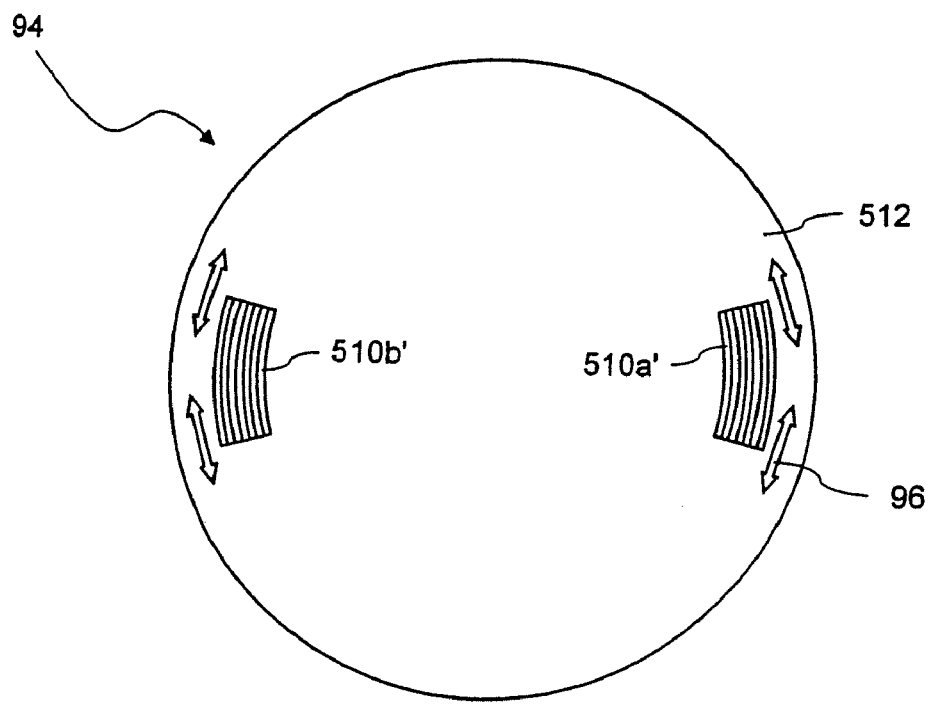
FIG. 29 shows a polarizer arrangement comprising a total of two polarizers for achieving a tangential polarization.

FIG. 29 shows in a top view a sixth polarizer arrangement 94 which includes a total of two polarizers 510a', 510b'. Each of the polarizers 510a', 510b' contains grating structures applied to a common substrate 512, as was explained above with reference to FIG. 28. The polarizers 510a', 510b' each cover a pole (not shown in FIG. 29) of a horizontal dipole illumination. Here, too, the grating structures are disposed tangentially and parallel to one another. However, in this case the grating is so designed that the polarization component disposed not perpendicularly but parallel to the longitudinal direction of the grating structures is transmitted, as was explained above with reference to FIG. 22. In this way tangential polarization is achieved at the poles. In FIG. 29 this is indicated by arrows 96.

Figure 30:
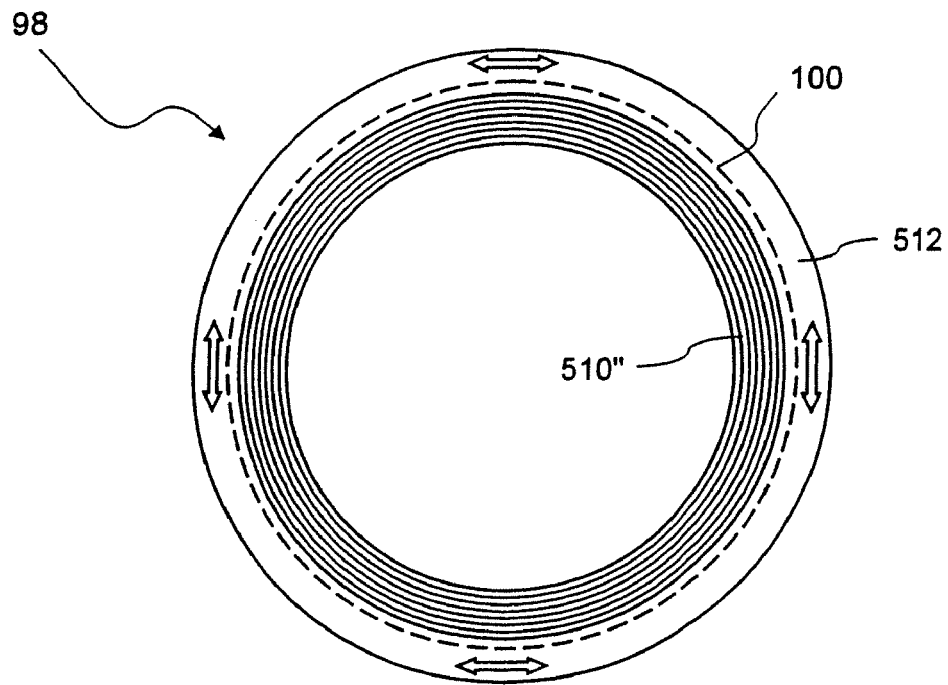
FIG. 30 shows a polarizer arrangement with an annular polarizer for achieving a radial polarization.

FIG. 30 shows in a top view a seventh polarizer arrangement 98 which includes an annular polarizer 510'', which may alternatively be composed of a plurality of individual segments adjacent to one another. The polarizer 510'' includes annular grating structures applied to a substrate 512 and disposed parallel to one another. The grating structures cover an annular zone which is illuminated in the pupil for ring illumination. In this case the grating is again designed such that the polarization component disposed perpendicularly to the longitudinal direction of the grating structures is transmitted.

In order to obtain tangential polarization, a half-wave plate 100 which rotates the polarization direction through 90° is associated with the polarizer arrangement 98. The half-wave plate 100 is arranged behind the polarizer arrangement and therefore is indicated only by a broken line in FIG. 30. The initially radial polarization distribution is converted into a tangential polarization distribution by the half-wave plate 100. Any other polarization-rotating element may, of course, be used instead of the half-wave plate 100.

Figure 31:
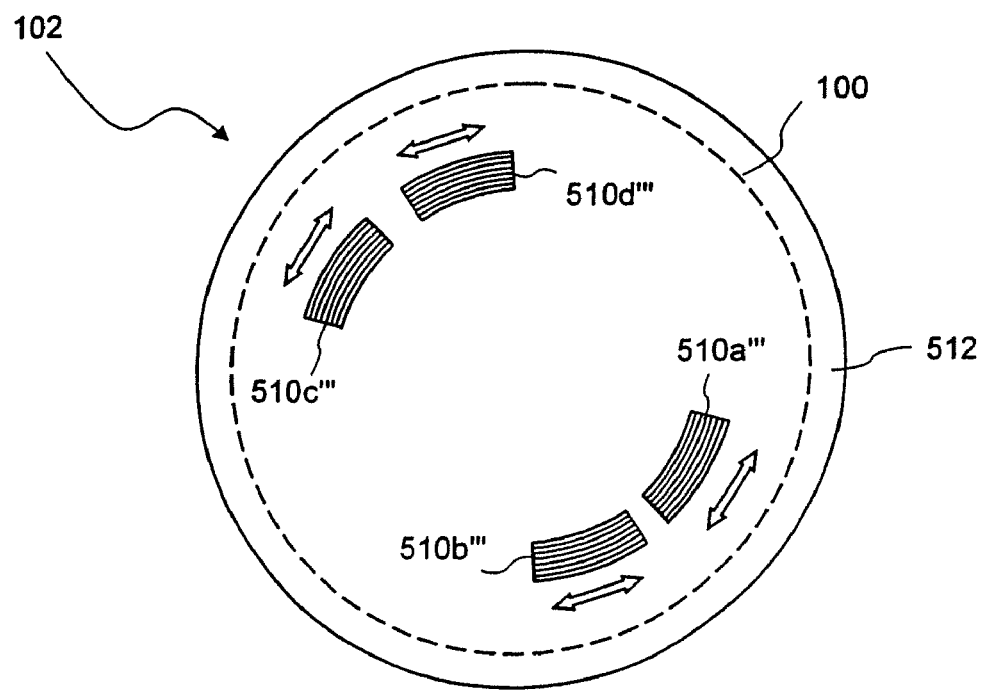
FIG. 31 shows a polarizer arrangement with a total of four polarizers for a novel illumination setting.

FIG. 31 shows in a top view an eighth polarizer arrangement 102 which includes four polarizers 510a''', 510b''', 510c''' and 510d'''. Each of the polarizers 510a''' to 510d''' contains grating structures applied to a common substrate 512, as was explained above with reference to FIG. 22. In this case the grating structures are curved and are disposed parallel to one another on the substrate 512.

The polarizers 510a''' to 510d''' each cover a pole (not shown in FIG. 31) of a novel illumination setting which is especially suited to projecting particular reticles. In this case the poles are disposed mirror-symmetrically with respect to an axis which passes through the pupil inclined at an angle of 45° to the horizontal. To achieve tangential polarization this embodiment, too, includes a half-wave plate 100 located behind the polarizer arrangement 102.

It is clear from the above exposition that the number, arrangement and polarization direction of the polarizers can be adapted in practically any desired manner to the conditions to be taken into account when projecting a given reticle. In the case of novel types of illumination, as shown e.g. in FIG. 31, it is sufficient to regroup the polarizers appropriately and to define the polarization direction appropriately by means of the alignment of the polarizing structures and, optionally, by adding polarization-rotating elements.

The invention claimed is:

1. A microlithographic projection exposure apparatus for imaging structures on a light sensitive layer, comprising an illumination system for illuminating the structures, wherein the illuminating system comprises
    a) at least one optical component that is configured to produce different illumination angle distributions of projection light, and
    b) a polarizer unit that polarizes projection light impinging on the light sensitive layer in dependence of the illumination angle distribution produced by the at least one optical component.

2. The apparatus of claim 1, wherein the at least one optical component and the polarizer unit are arranged at different axial positions with respect to an optical axis of the illumination system.

3. The apparatus of claim 1, wherein the polarizer unit comprises
    a plurality of different polarizer arrangements each including a plurality of polarizers and
    an exchange holder for positioning one of the polarizer arrangements in a pupil plane of the illumination system, said one polarizer being selected from the plurality of polarizer arrangements in dependency of the illumination angle distribution produced by the at least one optical component.

4. The apparatus of claim 3, wherein each polarizer arrangement comprises at least one polarizer having a polarization direction along which projection light is linearly polarized.

5. The apparatus of claim 4, wherein the direction is uniform over an area of the at least one polarizer.

6. The apparatus of claim 4, wherein at least one polarizer has polarization directions which are at least substantially aligned tangentially to circles which are concentric with the optical axis.

7. The apparatus of claim 3, wherein at least one polarizer arrangement comprises at least two polarizers that are arranged on a common carrier.

8. The apparatus of claim 7, wherein the at least one polarizer arrangement comprises two pairs of polarizers arranged point-symmetrically with respect to an optical axis of the illumination system.

9. The apparatus of claim 8, wherein the polarizers of each pair have the same polarization direction.

10. The apparatus of claim 8, wherein all polarizers have the same polarization direction.

11. The apparatus of claim 3, wherein at least one polarizer arrangement comprises a polarization-rotating element.

12. The apparatus of claim 1, wherein the at least one optical component is configured to produce illumination angular distributions that are associated with a dipole, a quadrupole and an annular illumination setting.

13. The illumination systems of claim 1, wherein the polarizer unit is arranged between the at least one optical component and the light sensitive layer.

* * * * *

UNITED STATES PATENT AND TRADEMARK OFFICE
CERTIFICATE OF CORRECTION

| | |
|---|---|
| PATENT NO. | : 7,847,920 B2 |
| APPLICATION NO. | : 11/703259 |
| DATED | : December 7, 2010 |
| INVENTOR(S) | : Damian Fiolka, Axel Scholz and Manfred Maul |

It is certified that error appears in the above-identified patent and that said Letters Patent is hereby corrected as shown below:

Title page, Item (63) Related U.S. Application Data, line 5, delete "and a continuation-in-part of" insert --and a continuation of--.

Title page, Item (56) References Cited, Page 2, Column 2, line 25, delete "Ploarizer" insert --Polarizer--.

Title page, Item (56) References Cited, Page 2, Column 2, line 26, delete "resonace" insert --resonance--.

Column 1, line 8, after "application" insert --is a continuation of U.S. Patent Application Serial No. 10/994,141, filed on November 19, 2004, which--.

Column 1, line 12, delete "both International Applications" insert --all of the above-referenced applications--.

Column 13, line 67, delete "pre-sent" insert --present--.

Column 15, line 14, delete "$P_1$" insert --$P_l$--;

Column 15, line 28, delete "$P_1$" insert --$P_l$--;

Column 19, line 15, delete "a" insert --the--;

Column 20, line 20, delete "pre-vent" insert --prevent--;

Column 23, line 11, delete "pre-dominant" insert --predominant--;

Signed and Sealed this
First Day of March, 2011

David J. Kappos
*Director of the United States Patent and Trademark Office*